TKS011653486B2

(12) United States Patent
Matsushita

(10) Patent No.: US 11,653,486 B2
(45) Date of Patent: May 16, 2023

(54) COMPONENT REPLENISHMENT MANAGEMENT SYSTEM AND COMPONENT MOUNTING SYSTEM

(71) Applicant: YAMAHA HATSUDOKI KABUSHIKI KAISHA, Iwata (JP)

(72) Inventor: Yoichi Matsushita, Shizuoka (JP)

(73) Assignee: YAMAHA HATSUDOKI KABUSHIKI KAISHA, Iwata (JP)

( * ) Notice: Subject to any disclaimer, the term of this patent is extended or adjusted under 35 U.S.C. 154(b) by 281 days.

(21) Appl. No.: 17/049,268

(22) PCT Filed: May 30, 2018

(86) PCT No.: PCT/JP2018/020783
§ 371 (c)(1),
(2) Date: Oct. 20, 2020

(87) PCT Pub. No.: WO2019/229880
PCT Pub. Date: Dec. 5, 2019

(65) Prior Publication Data
US 2021/0329821 A1 Oct. 21, 2021

(51) Int. Cl.
*H05K 13/08* (2006.01)
*G05B 19/042* (2006.01)
*H05K 13/04* (2006.01)

(52) U.S. Cl.
CPC ......... *H05K 13/086* (2018.08); *G05B 19/042* (2013.01); *H05K 13/0419* (2018.08); *H05K 13/0882* (2018.08); *G05B 2219/34436* (2013.01)

(58) Field of Classification Search
CPC ............. H05K 13/086; H05K 13/0419; H05K 13/0882; G05B 19/042; G05B 2219/34436
See application file for complete search history.

(56) References Cited

U.S. PATENT DOCUMENTS

| 5,329,690 | A | * | 7/1994 | Tsuji | ................... | H05K 13/086 |
| | | | | | | 29/430 |
| 6,507,765 | B1 | * | 1/2003 | Hopkins | .......... | G05B 19/41875 |
| | | | | | | 700/95 |
| 10,345,792 | B2 | * | 7/2019 | Yamazaki | .......... | G05B 19/4183 |
| 10,683,184 | B2 | * | 6/2020 | Oyama | .............. | H05K 13/0417 |
| 10,845,783 | B2 | * | 11/2020 | Yamazaki | .............. | G06Q 10/06 |

(Continued)

FOREIGN PATENT DOCUMENTS

| CN | 1221553 A | 6/1999 |
| CN | 1606903 A | 4/2005 |

(Continued)

OTHER PUBLICATIONS

International Search Report issued in PCT/JP2018/020783; dated Aug. 7, 2018.

*Primary Examiner* — Jeffrey T Carley
(74) *Attorney, Agent, or Firm* — Studebaker & Brackett PC

(57) ABSTRACT

In a component replenishment management system, a setting unit sets work allowable time of an operator in a work area, a replenishment target identification unit identifies component replenishment target devices which are targets of component replenishment work by the operator, and a work progress determination unit determines a progress state of the component replenishment work. Then, an extraction unit extracts the component replenishment target devices for which the component replenishment work is to be performed before work time in the work area by the operator reaches the work allowable time among the component replenishment target devices whose progress state of the component replenishment work is work not performed.

10 Claims, 20 Drawing Sheets

(56) References Cited

U.S. PATENT DOCUMENTS

| | | | |
|---|---|---|---|
| 10,935,937 B2* | 3/2021 | Ikeda | G05B 13/0255 |
| 2004/0143963 A1 | 7/2004 | Mehdianpour et al. | |
| 2008/0078834 A1* | 4/2008 | Woodward | H05K 13/086 |
| | | | 235/385 |
| 2008/0307240 A1* | 12/2008 | Dahan | G06F 1/324 |
| | | | 713/320 |
| 2009/0125424 A1* | 5/2009 | Wegelin | G03G 15/0865 |
| | | | 705/28 |
| 2009/0222123 A1* | 9/2009 | Nevills | G06Q 10/06 |
| | | | 700/104 |
| 2012/0123575 A1 | 5/2012 | Shim | |
| 2015/0208561 A1 | 7/2015 | Kawai et al. | |
| 2016/0021803 A1 | 1/2016 | Iwata et al. | |
| 2016/0353621 A1* | 12/2016 | Maezono | H05K 13/0417 |
| 2017/0020042 A1 | 1/2017 | Eguchi et al. | |
| 2017/0061365 A1* | 3/2017 | Nonoyama | H05K 13/02 |
| 2018/0113444 A1 | 4/2018 | Harada et al. | |
| 2020/0089201 A1 | 3/2020 | Harada et al. | |
| 2020/0170154 A1 | 5/2020 | Sugihara | |

FOREIGN PATENT DOCUMENTS

| | | | | |
|---|---|---|---|---|
| CN | 102469760 A | 5/2012 | | |
| CN | 102711432 A | 10/2012 | | |
| CN | 202773245 U | 3/2013 | | |
| CN | 203015380 U | 6/2013 | | |
| CN | 103582410 A | 2/2014 | | |
| CN | 104412730 A | 3/2015 | | |
| CN | 105144865 A | 12/2015 | | |
| CN | 105284200 A | 1/2016 | | |
| CN | 106211743 A | 12/2016 | | |
| CN | 106233827 A | 12/2016 | | |
| CN | 106358437 A | 1/2017 | | |
| CN | 107979969 A | 5/2018 | | |
| EP | 1024420 A1 | * | 8/2000 | H05K 13/085 |
| JP | H06-061699 A | | 3/1994 | |
| JP | 2004-134691 A | | 4/2004 | |
| JP | 2004119637 A | * | 4/2004 | H05K 13/085 |
| JP | 2008-276412 A | | 11/2008 | |
| JP | 2010-277181 A | | 12/2010 | |
| JP | 2013-175617 A | | 9/2013 | |
| JP | 5504088 B2 | | 5/2014 | |
| JP | 2014-149730 A | | 8/2014 | |
| JP | 2014-175327 A | | 9/2014 | |
| JP | 5899419 B2 | | 4/2016 | |
| WO | 97/48263 A1 | | 12/1997 | |
| WO | WO-2012172715 A1 | * | 12/2012 | H05K 13/0857 |
| WO | 2014/038082 A1 | | 3/2014 | |
| WO | 2017/208325 A1 | | 12/2017 | |

* cited by examiner

FIG. 8

ATTACHMENT INFORMATION JH1

| MOUNTER TYPE | COMPONENT SUPPLY DEVICE | | COMPONENT TYPE | PRECEDING COMPONENT REMAINING NUMBER | TOTAL COMPONENT REMAINING NUMBER | COMPONENT REMAINING NUMBER WARNING VALUE | COMPONENT REMAINING NUMBER STOP VALUE |
|---|---|---|---|---|---|---|---|
| | SET POSITION | DEVICE TYPE | | | | | |
| J11 | J12 | J13 | J14 | J15 | J16 | J17 | J18 |
| M1 | S11 | F1 | P11 | NA1 | NA11 | NW11 | NS11 |
| | S12 | F1 | P12 | NA2 | NA12 | NW12 | NS12 |
| | S13 | F1 | P13 | NA3 | NA13 | NW13 | NS13 |
| | ... | ... | ... | ... | ... | ... | ... |

FIG. 10

PRODUCTION PLAN INFORMATION JH2

| PRODUCTION ORDER | SUBSTRATE TYPE | PRODUCTION QUANTITY | CYCLE TIME (SECOND/SHEET) |
|---|---|---|---|
| 1 | SUBSTRATE A | AA | CTA |
| 2 | SUBSTRATE B | BB | CTB |
| ... | ... | ... | ... |

J21, J22, J23, J24

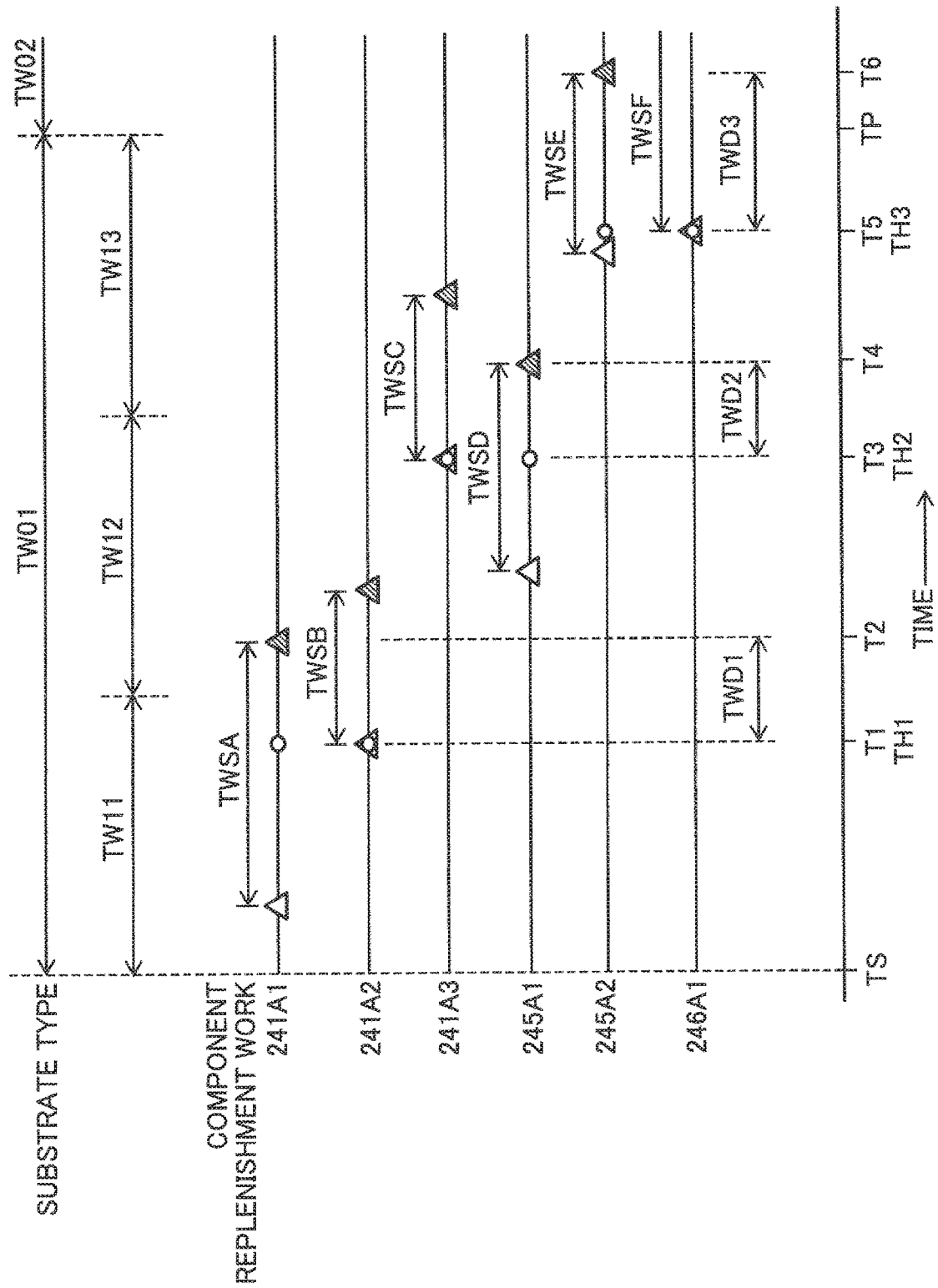

FIG. 13

WORK ALLOWABLE TIME: WPT — J40

COMPONENT REPLENISHMENT MANAGEMENT INFORMATION JH4
WORK LIST INFORMATION J4

| J41 | J42 | J43 | J44 | J11 | J12 COMPONENT SUPPLY DEVICE | | J14 | J16 | J31 | J45 | J46 | J47 | J48 | J49 | J50 |
|---|---|---|---|---|---|---|---|---|---|---|---|---|---|---|---|
| MOVEMENT ROUTE NUMBER | WORK TARGET AREA NUMBER | COMPONENT MOUNTING LINE NAME | LANE NAME | MOUNTER TYPE | SET POSITION | DEVICE TYPE | COMPONENT TYPE | TOTAL COMPONENT REMAINING NUMBER | COMPONENT REQUIRED NUMBER (NUMBER/SHEET) | REPLENISHABLE TIME | WARNING TIME | STOP TIME | PRODUCIBLE TIME | WORK PROGRESS STATE | WORK STANDARD TIME |
| 1 | WA1 | L1 | LL1 | M1 | S11 | AF | P11 | NA11 | N11 | TT11 | WT11 | ST11 | PT11 | WORK END | WS1 |
| 1 | WA1 | L1 | LL1 | M1 | S12 | AF | P12 | NA12 | N12 | TT12 | WT12 | ST12 | PT12 | WORK END | WS1 |
| 1 | WA1 | L1 | LL1 | M1 | S13 | SPF | P13 | NA13 | N13 | TT13 | WT13 | ST13 | PT13 | WORK END | WS11 |
| 1 | WA2 | L1 | LL1 | M2 | S21 | AF | P21 | NA21 | N21 | TT21 | WT21 | ST21 | PT21 | NOT PERFORMED | WS1 |
| 1 | WA3 | L1 | LL1 | M3 | S31 | AF | P31 | NA31 | N31 | TT31 | WT31 | ST31 | PT31 | NOT PERFORMED | WS1 |
| 1 | WA3 | L1 | LL1 | M3 | S32 | AF | P32 | NA32 | N32 | TT32 | WT32 | ST32 | PT32 | NOT PERFORMED | WS1 |
| 1 | WA3 | L1 | LL1 | M3 | S33 | AF | P33 | NA33 | N33 | TT33 | WT33 | ST33 | PT33 | NOT PERFORMED | WS1 |
| 1 | WA3 | L1 | LL1 | M3 | S34 | AF | P34 | NA34 | N34 | TT34 | WT34 | ST34 | PT34 | NOT PERFORMED | WS1 |
| 1 | WA4 | L1 | LL1 | M4 | S41 | TF | P41 | NA41 | N41 | TT41 | WT41 | ST41 | PT41 | NOT PERFORMED | WS1 |
| 1 | WA4 | L1 | LL1 | M4 | S42 | TF | P42 | NA42 | N42 | TT42 | WT42 | ST42 | PT42 | NOT PERFORMED | WS2 |
| 1 | WA6 | L1 | LL1 | M6 | S61 | SF | P61 | NA61 | N61 | TT61 | WT61 | ST61 | PT61 | NOT PERFORMED | WS2 |
| 1 | WA6 | L1 | LL1 | M6 | S62 | SF | P62 | NA62 | N62 | TT62 | WT62 | ST62 | PT62 | NOT PERFORMED | WS3 |

FIG. 15

WORK ALLOWABLE TIME: WPT — J40
REMAINING TIME: LT — J51
TOTAL WORK TIME OF EXTRACTION TARGET: TO — J52

COMPONENT REPLENISHMENT MANAGEMENT INFORMATION JH4
WORK LIST INFORMATION J4

| Movement Route Number (J41) | Work Target Area Number (J42) | Component Mounting Line Name (J43) | Lane Name (J44) | Mounter Type (J11) | Component Supply Device - Set Position (J12) | Component Supply Device - Device Type (J13) | Component Type (J14) | Total Component Remaining Number (J16) | Component Required Number (number/sheet) (J31) | Replenishable Time (J45) | Warning Time (J46) | Stop Time (J47) | Producible Time (J48) | Work Progress State (J49) | Work Standard Time (J50) |
|---|---|---|---|---|---|---|---|---|---|---|---|---|---|---|---|
| 1 | WA1 | L1 | LL1 | M1 | S11 | AF | P11 | NA11 | N11 | TT11 | WT11 | ST11 | PT11 | WORK END | WS1 |
| 1 | WA1 | L1 | LL1 | M1 | S12 | AF | P12 | NA12 | N12 | TT12 | WT12 | ST12 | PT12 | WORK END | WS1 |
| 1 | WA1 | L1 | LL1 | M1 | S13 | SPF | P13 | NA13 | N13 | TT13 | WT13 | ST13 | PT13 | WORK END | WS11 |
| 1 | WA2 | L1 | LL1 | M2 | S21 | AF | P21 | NA21 | N21 | TT21 | WT21 | ST21 | PT21 | NOT PERFORMED | WS1 |
| 1 | WA3 | L1 | LL1 | M3 | S31 | AF | P31 | NA31 | N31 | TT31 | WT31 | ST31 | PT31 | NOT PERFORMED | WS1 |
| 1 | WA4 | L1 | LL1 | M4 | S41 | TF | P41 | NA41 | N41 | TT41 | WT41 | ST41 | PT41 | NOT PERFORMED | WS2 |
| 1 | WA3 | L1 | LL1 | M3 | S33 | AF | P33 | NA33 | N33 | TT33 | WT33 | ST33 | PT33 | NOT PERFORMED | WS1 |
| 1 | WA6 | L1 | LL1 | M6 | S61 | SF | P61 | NA61 | N61 | TT61 | WT61 | ST61 | PT61 | SKIP | WS3 |
| 1 | WA6 | L1 | LL1 | M6 | S62 | SF | P62 | NA62 | N62 | TT62 | WT62 | ST62 | PT62 | SKIP | WS3 |
| 1 | WA3 | L1 | LL1 | M3 | S32 | AF | P32 | NA32 | N32 | TT32 | WT32 | ST32 | PT32 | SKIP | WS1 |
| 1 | WA3 | L1 | LL1 | M3 | S34 | AF | P34 | NA34 | N34 | TT34 | WT34 | ST34 | PT34 | SKIP | WS1 |
| 1 | WA4 | L1 | LL1 | M4 | S42 | TF | P42 | NA42 | N42 | TT42 | WT42 | ST42 | PT42 | SKIP | WS2 |

FIG. 16

COMPONENT REPLENISHMENT MANAGEMENT INFORMATION JH4

WORK LIST INFORMATION J4

WORK ALLOWABLE TIME: WPT
REMAINING TIME: LT
TOTAL WORK TIME OF EXTRACTION TARGET: TO

| J41 MOVEMENT ROUTE NUMBER | J42 WORK TARGET AREA NUMBER | J43 COMPONENT MOUNTING LINE NAME | J44 LANE NAME | J11 MOUNTER TYPE | J12 COMPONENT SUPPLY DEVICE SET POSITION | J13 COMPONENT SUPPLY DEVICE DEVICE TYPE | J14 COMPONENT TYPE | J16 TOTAL COMPONENT REMAINING NUMBER | J31 COMPONENT REQUIRED NUMBER (NUMBER/SHEET) | J45 REPLENISHABLE TIME | J46 WARNING TIME | J47 STOP TIME | J48 PRODUCIBLE TIME | J49 WORK PROGRESS STATE | J50 WORK STANDARD TIME |
|---|---|---|---|---|---|---|---|---|---|---|---|---|---|---|---|
| 1 | WA1 | L1 | LL1 | M1 | S11 | AF | P11 | NA11 | N11 | TT11 | WT11 | ST11 | PT11 | WORK END | WS1 |
| 1 | WA1 | L1 | LL1 | M1 | S12 | AF | P12 | NA12 | N12 | TT12 | WT12 | ST12 | PT12 | WORK END | WS1 |
| 1 | WA1 | L1 | LL1 | M1 | S13 | SPF | P13 | NA13 | N13 | TT13 | WT13 | ST13 | PT13 | WORK END | WS11 |
| 1 | WA2 | L1 | LL1 | M2 | S21 | AF | P21 | NA21 | N21 | TT21 | WT21 | ST21 | PT21 | NOT PERFORMED | WS1 |
| 1 | WA3 | L1 | LL1 | M3 | S31 | AF | P31 | NA31 | N31 | TT31 | WT31 | ST31 | PT31 | NOT PERFORMED | WS1 |
| 1 | WA3 | L1 | LL1 | M3 | S32 | AF | P32 | NA32 | N32 | TT32 | WT32 | ST32 | PT32 | SKIP | WS1 |
| 1 | WA3 | L1 | LL1 | M3 | S33 | AF | P33 | NA33 | N33 | TT33 | WT33 | ST33 | PT33 | NOT PERFORMED | WS1 |
| 1 | WA3 | L1 | LL1 | M3 | S34 | AF | P34 | NA34 | N34 | TT34 | WT34 | ST34 | PT34 | NOT PERFORMED | WS1 |
| 1 | WA4 | L1 | LL1 | M4 | S41 | TF | P41 | NA41 | N41 | TT41 | WT41 | ST41 | PT41 | SKIP | WS2 |
| 1 | WA4 | L1 | LL1 | M4 | S42 | TF | P42 | NA42 | N42 | TT42 | WT42 | ST42 | PT42 | SKIP | WS2 |
| 1 | WA6 | L1 | LL1 | M6 | S61 | SF | P61 | NA61 | N61 | TT61 | WT61 | ST61 | PT61 | SKIP | WS3 |
| 1 | WA6 | L1 | LL1 | M6 | S62 | SF | P62 | NA62 | N62 | TT62 | WT62 | ST62 | PT62 | SKIP | WS3 |

FIG. 17

WORK ALLOWABLE TIME: WPT

REMAINING TIME: LT

TOTAL WORK TIME OF EXTRACTION TARGET: T0

COMPONENT REPLENISHMENT MANAGEMENT INFORMATION JH4

WORK LIST INFORMATION J4

| J41 MOVEMENT ROUTE NUMBER | J42 WORK TARGET AREA NUMBER | J43 COMPONENT MOUNTING LINE NAME | J44 LANE NAME | J11 MOUNTER TYPE | J12 COMPONENT SUPPLY DEVICE SET POSITION | J13 DEVICE TYPE | J14 COMPONENT TYPE | J16 TOTAL COMPONENT REMAINING NUMBER | J31 COMPONENT REQUIRED NUMBER (NUMBER/SHEET) | J45 REPLENISHABLE TIME | J46 WARNING TIME | J47 STOP TIME | J48 PRODUCIBLE TIME | J49 WORK PROGRESS STATE | J50 WORK STANDARD TIME |
|---|---|---|---|---|---|---|---|---|---|---|---|---|---|---|---|
| 1 | WA1 | L1 | LL1 | M1 | S11 | AF | P11 | NA11 | N11 | TT11 | WT11 | ST11 | PT11 | WORK END | WS1 |
| 1 | WA1 | L1 | LL1 | M1 | S12 | AF | P12 | NA12 | N12 | TT12 | WT12 | ST12 | PT12 | WORK END | WS1 |
| 1 | WA1 | L1 | LL1 | M1 | S13 | SPF | P13 | NA13 | N13 | TT13 | WT13 | ST13 | PT13 | WORK END | WS11 |
| 1 | WA2 | L1 | LL1 | M2 | S21 | AF | P21 | NA21 | N21 | TT21 | WT21 | ST21 | PT21 | WORK END | WS1 |
| 1 | WA3 | L1 | LL1 | M3 | S31 | AF | P31 | NA31 | N31 | TT31 | WT31 | ST31 | PT31 | WORK END | WS1 |
| 1 | WA3 | L1 | LL1 | M3 | S32 | AF | P32 | NA32 | N32 | TT32 | WT32 | ST32 | PT32 | SKIP | WS1 |
| 1 | WA3 | L1 | LL1 | M3 | S33 | AF | P33 | NA33 | N33 | TT33 | WT33 | ST33 | PT33 | WORK END | WS1 |
| 1 | WA3 | L1 | LL1 | M3 | S34 | AF | P34 | NA34 | N34 | TT34 | WT34 | ST34 | PT34 | SKIP | WS1 |
| 1 | WA4 | L1 | LL1 | M4 | S41 | TF | P41 | NA41 | N41 | TT41 | WT41 | ST41 | PT41 | WORK END | WS1 |
| 1 | WA4 | L1 | LL1 | M4 | S42 | TF | P42 | NA42 | N42 | TT42 | WT42 | ST42 | PT42 | SKIP | WS2 |
| 1 | WA6 | L1 | LL1 | M6 | S61 | SF | P61 | NA61 | N61 | TT61 | WT61 | ST61 | PT61 | NOT PERFORMED | WS3 |
| 1 | WA6 | L1 | LL1 | M6 | S62 | SF | P62 | NA62 | N62 | TT62 | WT62 | ST62 | PT62 | NOT PERFORMED | WS3 |

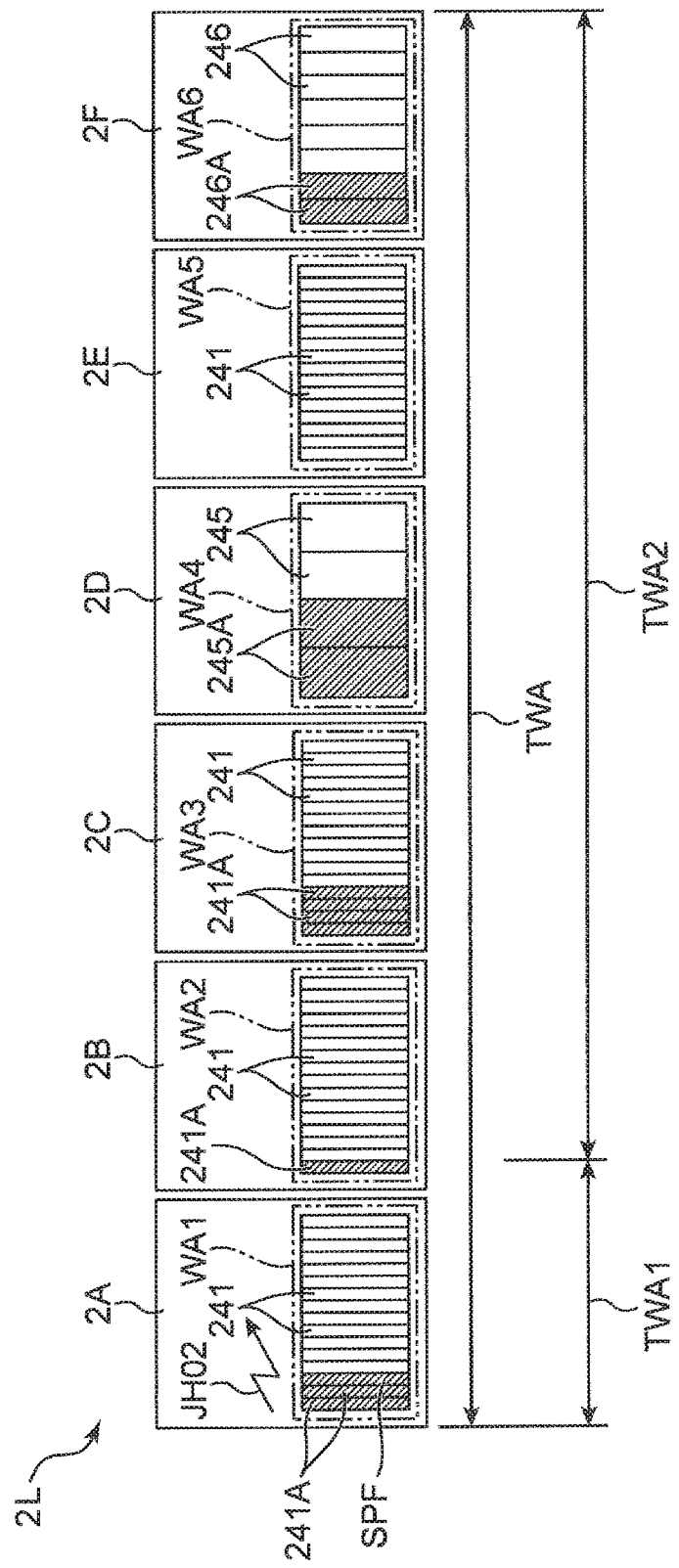

COMPONENT REPLENISHMENT MANAGEMENT SYSTEM AND COMPONENT MOUNTING SYSTEM

CROSS-REFERENCE TO RELATED APPLICATION

This application is a National Stage of International Patent Application No. PCT/JP2018/020783, filed May 30, 2018, the entire content of which is incorporated herein by reference.

BACKGROUND

Technical Field

The present disclosure relates to a component replenishment management system that manages component replenishment work for each of a plurality of component supply devices attached to each component mounter on a component mounting line, and a component mounting system including the component replenishment management system.

Background Art

A component mounting line for producing a component mounting substrate in which an electronic component (hereinafter simply referred to as the "component") is mounted on a substrate such as a printed wiring substrate is configured by connecting a plurality of component mounters that mount the component on a substrate. A plurality of component supply devices that can mount a component storage member are provided in parallel in each component mounter. When a component mounting substrate is produced by each component mounter in the component mounting line, an operator performs setup work such as mounting a component storage member required for production in a component supply device, and then production is started. During the production of the component mounting substrate, an operator performs component replenishment work for replenishing the component supply device with the component storage member according to consumption of the component accompanying the production of the component mounting substrate in order to prevent the supply of the component from the component supply device from being stopped and the production of the component mounting substrate from being stopped. The operator performs the component replenishment work while moving on a movement route along the component mounting line within a work area set on the component mounting line.

For example, Japanese Patent Laid-Open No. 2004-134691 discloses a technique for achieving improvement in the efficiency of the component replenishment work by an operator. In the technique disclosed in Japanese Patent Laid-Open No. 2004-134691, a component running out time of the component supply device is predicted, and a schedule for the component replenishment work is created based on the predicted time.

When the operator performs the component replenishment work while moving on the movement route in the work area, there is a case where, for example, work allowable time allowed for time from the start point to the end point of the movement route is set in view of a production plan of the component mounting substrate. In a case where such work allowable time is set, if the operator performs the work in order while moving on the movement route according to the schedule of the component replenishment work, there is a possibility that the work allowable time elapses before all the work is finished. In a case where indispensable work to be performed exists among the component replenishment work that could not be finished within the work allowable time, the supply of the component from the component supply device may be stopped due to the unperformed component replenishment work, and the production efficiency of the component mounting substrate may be lowered.

SUMMARY

The present disclosure has been made in view of such circumstances, and thus provides a component replenishment management system capable of improving the efficiency of component replenishment work for a component supply device, and a component mounting system including the component replenishment management system.

A component replenishment management system according to one aspect of the present disclosure is a system that manages component replenishment work for replenishing each of a plurality of component supply devices capable of mounting a plurality of component storage members with the component storage member in one or a plurality of component mounting lines in which a plurality of component mounters are connected, the component mounters being for mounting a component supplied from the plurality of component supply devices on a substrate to produce a component mounting substrate. The component replenishment management system includes a setting unit configured to set work allowable time from a start point to an end point of a predetermined movement route in a work area set to the component mounting lines for an operator who performs the component replenishment work while moving on the movement route in the work area, a replenishment target identification unit configured to identify a plurality of component supply devices for which the component replenishment work is allowed to be performed as a component replenishment target device that is a target of the component replenishment work based on a supply state of a component in each of the plurality of the component supply devices, a work progress determination unit configured to monitor a progress state of the component replenishment work for each of the component replenishment target devices and determine whether the progress state is a state of work end or work not performed, and an extraction unit configured to extract a component replenishment target device for which the component replenishment work is to be performed before work time in the work area by the operator reaches the work allowable time among the component replenishment target devices whose progress state of the component replenishment work is the work not performed.

A component mounting system according to another aspect of the present disclosure includes one or a plurality of component mounting lines in which a plurality of component mounters are connected, the component mounters being for mounting a component supplied from a plurality of component supply devices capable of mounting a component storage member on a substrate to produce a component mounting substrate, and the component replenishment management system that manages component replenishment work for replenishing each of the plurality of component supply devices with the component storage member.

The object, feature, and advantage of the present disclosure will become more clear by detailed description below and the accompanying drawings.

BRIEF DESCRIPTION OF THE DRAWINGS

FIG. 8 is a diagram for describing attachment information stored in a memory unit of a mounting control device;

FIG. 10 is a diagram for describing production plan information input to the component replenishment management system;

FIG. 12 is a diagram for describing control operation of a component supply monitoring unit and a replenishment management unit in the component replenishment management system;

FIG. 13 is a diagram for describing component replenishment management information generated by the replenishment management unit and a work progress determination unit of the component replenishment management system;

FIG. 15 is a diagram for describing the component replenishment management information to which information regarding extraction operation by an extraction unit of the component replenishment management system is added;

FIG. 16 is a diagram for describing the component replenishment management information to which an extraction result of the extraction unit is added;

FIG. 17 is a diagram for describing the component replenishment management information to which an extraction result of the extraction unit is added;

FIG. 18B is a diagram for describing a modified example of the operation of the component replenishment management system.

DETAILED DESCRIPTION

Hereinafter, a component replenishment management system and a component mounting system according to an embodiment of the present disclosure will be described with reference to the drawings.

[Overall Configuration of Component Mounting System]

Figure 1:
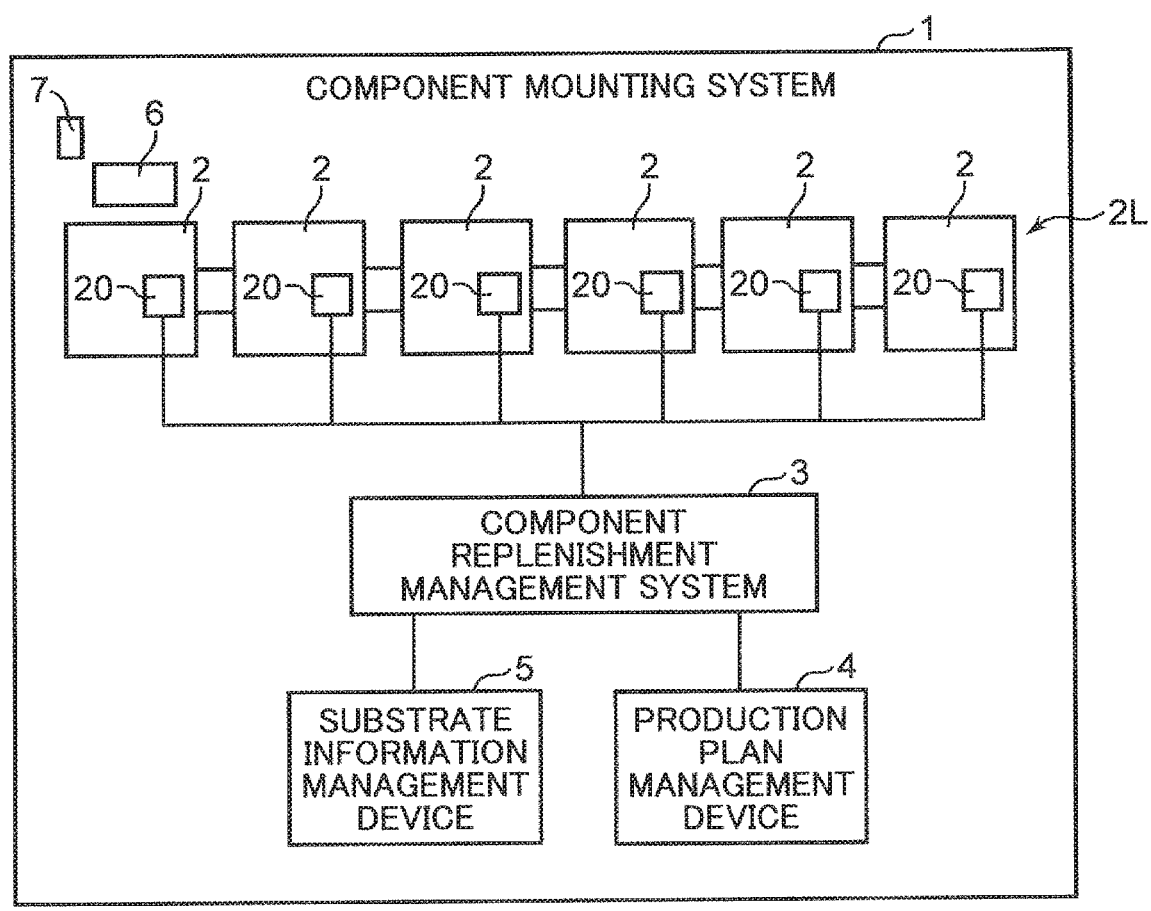
FIG. 1 is a diagram schematically showing a configuration of a component mounting system according to an embodiment of the present disclosure.

FIG. 1 is a diagram schematically showing a configuration of a component mounting system 1 according to an embodiment of the present disclosure. The component mounting system 1 includes a component mounting line 2L, a component replenishment management system 3, a production plan management device 4, a substrate information management device 5, and a cart 6 and a mobile terminal device 7 operated by an operator. In the component mounting system 1, a mounting control device 20 of each component mounter 2 that constitutes the component mounting line 2L, the production plan management device 4, the substrate information management device 5, and the mobile terminal device 7 are connected to the component replenishment management system 3 in a data communicable manner.

The component mounting line 2L is configured by a plurality of component mounters 2 connected to each other. In the component mounting line 2L, each of the plurality of component mounters 2 is connected in a manner arranged in a straight line by a connecting conveyor that conveys a substrate between the component mounters 2. In the example shown in FIG. 1, six component mounters 2 are connected in the component mounting line 2L. Note that, although FIG. 1 shows only one component mounting line 2L, the component mounting system 1 may have a configuration including a plurality of component mounting lines 2L.

<Configuration of Component Mounter>

Figure 2:
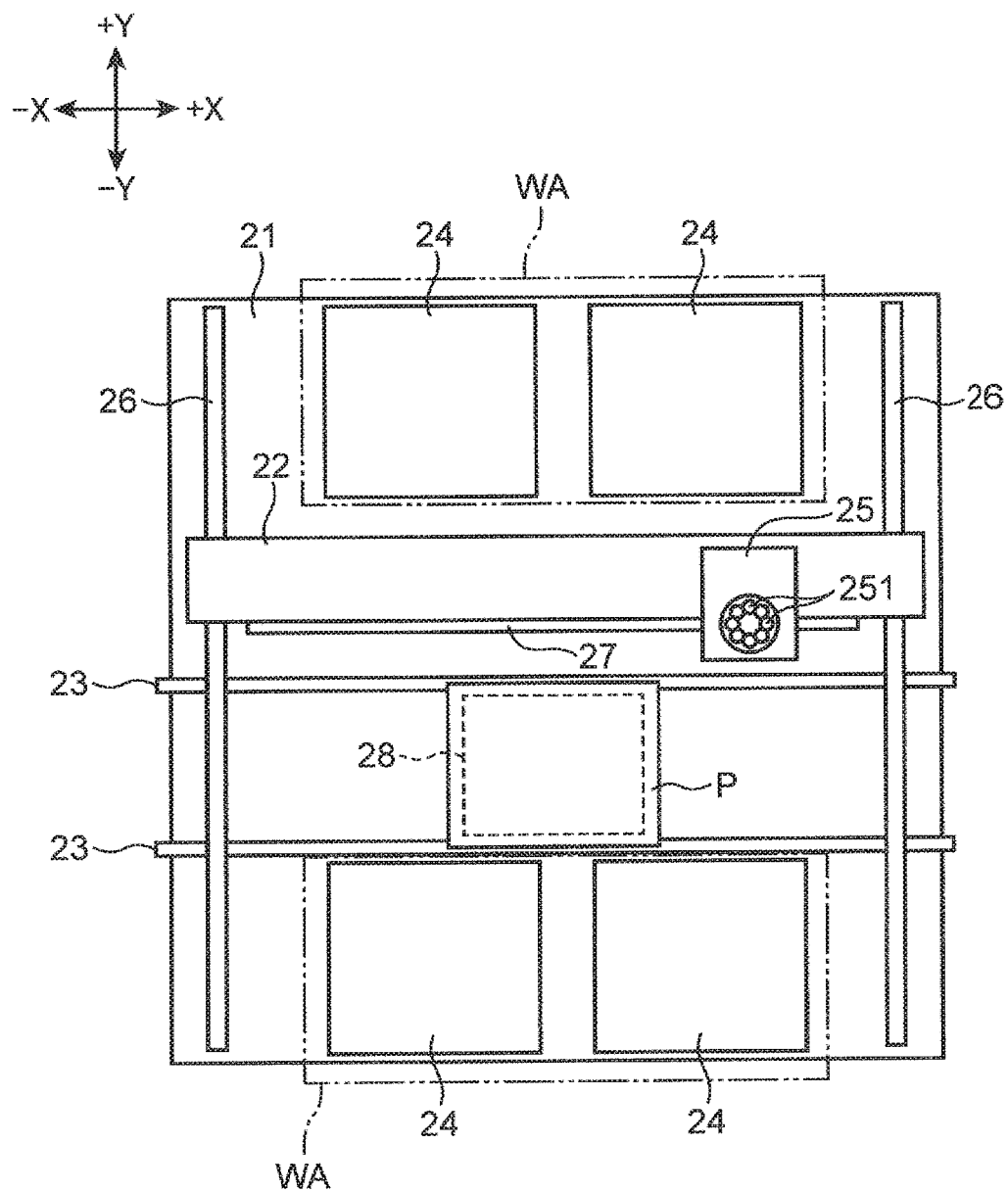
FIG. 2 is a plan view showing a configuration of a component mounter.

First, a configuration of the component mounter 2 will be described with reference to FIG. 2. FIG. 2 is a plan view showing the configuration of the component mounter 2. Note that, hereinafter, the directional relationship will be described using XY orthogonal coordinate axes. One direction side in the X-axis direction is referred to as "+X side", and the other direction side opposite to the one direction side in the X-axis direction is referred to as "−X side". Further, one direction side in the Y-axis direction is referred to as "+Y side", and the other direction side opposite to the one direction side in the Y-axis direction is referred to as "−Y side".

The component mounter 2 is a device that mounts the component on the substrate P to produce a component mounting substrate. The component mounter 2 includes a main body frame 21, a moving frame 22, a conveyor 23, a component supply unit 24, a head unit 25, a first drive mechanism 26, a second drive mechanism 27, and a substrate support device 28.

The main body frame 21 is a structure in which each unit constituting the component mounter 2 is disposed, and is formed in a substantially rectangular shape in a plan view when viewed in a direction orthogonal to both the X-axis direction and the Y-axis direction. The conveyor 23 extends in the X-axis direction and is disposed on the main body frame 21. The conveyor 23 conveys the substrate P in the X-axis direction. The substrate P conveyed on the conveyor 23 is positioned by a substrate support device 28 at a predetermined work position (a component mounting position where the component is mounted on the substrate P). The substrate support device 28 positions the substrate P by supporting the substrate P with a backup pin.

The component supply units 24 are disposed in a total of four locations, two locations in the X-axis direction in each of +Y side and −Y side regions in the Y-axis direction of the main body frame 21. The component supply unit 24 supplies the component mounted on the substrate P, and has a plurality of component supply devices provided in parallel. The component supply device disposed in the component supply unit 24 will be described later.

The moving frame 22 extends in the X-axis direction and is supported by the main body frame 21 so as to be movable in a predetermined moving direction (Y-axis direction). The head unit 25 is mounted on the moving frame 22. The head unit 25 is mounted on the moving frame 22 so as to be movable in the X-axis direction. That is, the head unit 25 is movable in the Y-axis direction along with the movement of the moving frame 22, and is also movable in the X-axis direction along the moving frame 22. The head unit 25 is movable between the component supply unit 24 and a predetermined working position of the substrate P conveyed by the conveyor 23, and takes out the component from the component supply unit 24 and mounts the taken-out component on the substrate P. The head unit 25 includes an adsorption nozzle 251. The adsorption nozzle 251 is a holder capable of sucking and holding the component supplied by the component supply unit 24. The adsorption nozzle 251 can communicate with any of a negative pressure generation device, a positive pressure generation device, and the atmosphere via an electric switching valve. That is, adsorption and holding of the component (taking out of the component) by the adsorption nozzle 251 becomes possible as a negative pressure is supplied to the adsorption nozzle 251, and thereafter, the adsorption and holding of the component is released as a positive pressure is supplied.

The first drive mechanism 26 is disposed in end portions on the +X side and −X side of the main body frame 21. The first drive mechanism 26 is a mechanism that moves the moving frame 22 in the Y-axis direction. The first drive mechanism 26 is configured to include, for example, a drive motor, a ball screw shaft that extends in the Y-axis direction and is connected to the drive motor, and a ball nut that is provided on the moving frame 22 and screwed with the ball screw shaft. The first drive mechanism 26 having such a configuration moves the moving frame 22 in the Y-axis direction by the ball nut moving forward and backward along the ball screw shaft as the ball screw shaft is rotationally driven by the drive motor.

The second drive mechanism 27 is provided on the moving frame 22. The second drive mechanism 27 is a mechanism that moves the head unit 25 in the X-axis direction along the moving frame 22. Similar to the first drive mechanism 26, the second drive mechanism 27 includes, for example, a drive motor, a ball screw shaft that extends in the X-axis direction and is connected to the drive motor, and a ball nut that is provided on the head unit 25 and screwed with the ball screw shaft. The second drive mechanism 27 having such a configuration moves the head unit 25 in the X-axis direction by the ball nut moving forward and backward along the ball screw shaft as the ball screw shaft is rotationally driven by the drive motor.

<Regarding Component Supply Device>

The component supply devices provided in parallel in the component supply unit 24 are roughly classified into a tape feeder, a tray feeder, and a stick feeder according to a difference in a component supply system. In each of the component supply units 24 of the component mounter 2, one type of component supply devices having the same component supply system may be disposed, or two or more types of component supply devices having different component supply systems may be disposed.

(Tape Feeder)

First, a tape feeder serving as the component supply device is configured such that a component storage tape containing the components at predetermined intervals is wound around a reel serving as a component storage member, and the component storage tape is sent out from the reel. The tape feeders are roughly classified into a splicing feeder and an automatic loading feeder (AF). The splicing feeder is configured so that one reel is mounted. Before sending out of the component storage tape from the reel is completed and the component runs out, transition is made from the component storage tape to a subsequent component storage tape. For this purpose, an end portion of the preceding component storage tape and a front portion of the subsequent component storage tape are attached with a splicing tape or the like so as to be connected to each other. That is, in the splicing feeder, the splicing work of attaching with a splicing tape or the like is performed before sending out of the component storage tape from one reel is completed and the component runs out. Accordingly, a replenishment timing with a reel wound with the subsequent component storage tape is restricted to a time point at which sending out of the preceding component storage tape is completed.

On the other hand, the AF is configured so that a plurality of reels can be mounted. Upon completion of sending out of a component storage tape from a preceding reel wound with a component storage tape (hereinafter referred to as a "preceding component storage tape") by which the component is supplied first among the plurality of reels, a component storage tape is sent out from a subsequent reel wound with a subsequent component storage tape automatically without the need of splicing work if there is a subsequent component storage tape that has already been inserted in the AF. That is, in the AF, the replenishment timing with a new reel is not restricted to a time point at which sending out of a component storage tape from a preceding reel wound with the preceding component storage tape is completed, and the component replenishment work can be performed at any time as long as a subsequent component storage tape can be inserted in the AF. Accordingly, there is more degree of freedom as compared with the splicing feeder.

Figure 3:
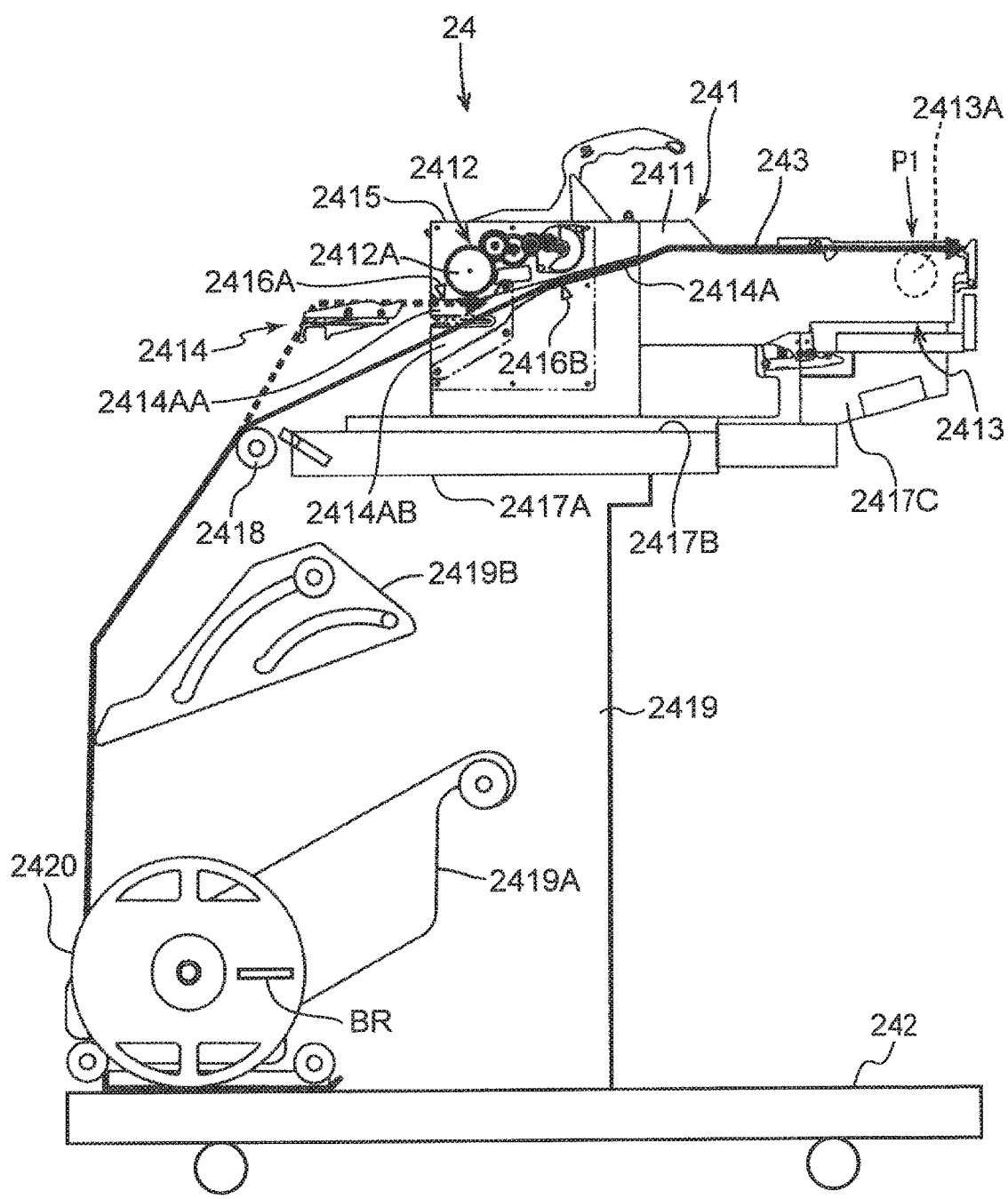
FIG. 3 is a diagram schematically showing a tape feeder as a component supply device disposed in a component supply unit of the component mounter.
Figure 4:
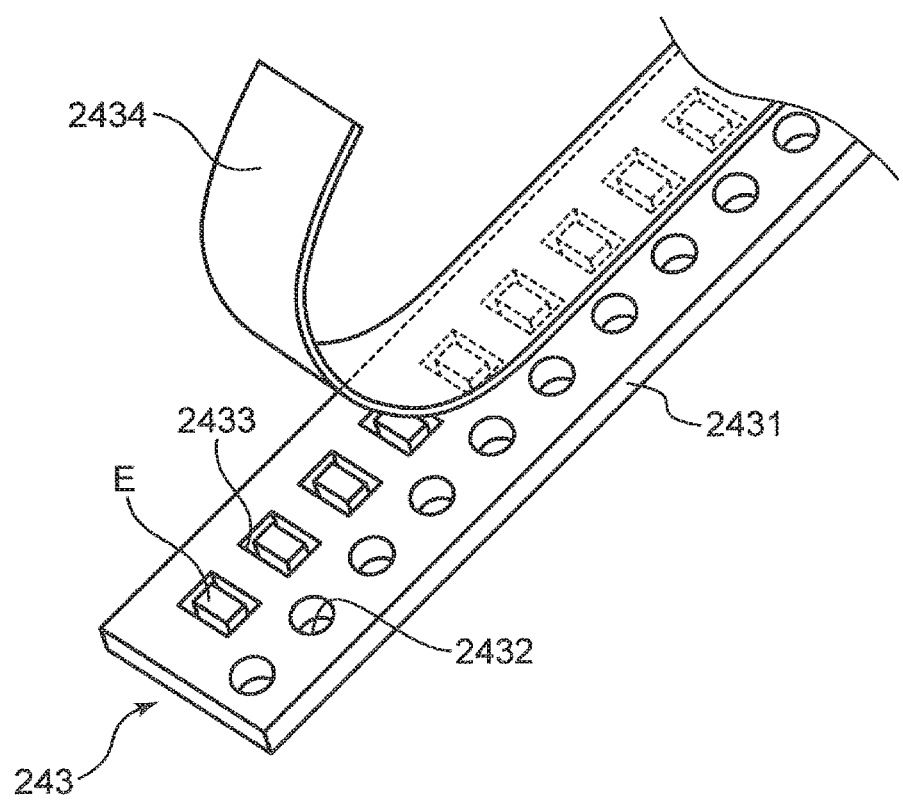
FIG. 4 is a perspective view showing a component storage tape mounted on the tape feeder.

The tape feeder disposed in the component supply unit 24 may be a mixture of the splicing feeder and the AF. In the present embodiment, a plurality of AFs capable of being mounted with a plurality of reels as the component storage member are disposed as the component supply device. The tape feeder including the AF as the component supply device will be described with reference to FIGS. 3 and 4. FIG. 3 is a diagram schematically showing a configuration of an AF 241, and FIG. 4 is a perspective view showing a component storage tape 243 mounted on the AF 241.

In the component supply unit 24, the AF 241 is disposed on a carriage 242. The AF 241 can be mounted with a plurality of reels 2420 around which the component storage tape 243 is wound.

Prior to description of the configuration of the AF 241, the component storage tape 243 will be described with reference to FIG. 4. The component storage tape 243 includes a carrier tape 2431 and a cover tape 2434. The carrier tape 2431 is a tape on which a plurality of component storage portions 2433 for storing a component E are arranged at predetermined intervals. Further, the carrier tape 2431 has, in one end portion in the width direction of the carrier tape 2431, conveying force transmission holes 2432, which are arranged at predetermined intervals and fitted to tooth portions of a first sprocket 2412A and a second sprocket 2413A in the AF 241 described later, and to which a conveying force for sending out the component storage tape 243 is transmitted by the first sprocket 2412A and the second sprocket 2413A. The cover tape 2434 is a tape attached to the carrier tape 2431 so as to cover the component storage portion 2433.

As shown in FIG. 3, the AF 241 is attached to a feeder attachment unit 2417A provided in the component supply unit 24. Specifically, the component supply unit 24 is provided with the feeder attachment unit 2417A and a reel support unit 2419. The feeder attachment unit 2417A is provided with a plurality of slots 2417B arranged at regular intervals in the X-axis direction and extending parallel to each other in the Y-axis direction, and a fixed base 2417C extending in the X-axis direction at a position in front of these slots 2417B. Then, the AF 241 is set in each of the slots 2417B, and each of the AFs 241 is fixed to the fixed base 2417C. In this manner, the plurality of AFs 241 are provided side by side on the carriage 242 in the component supply unit 24.

The reel support unit 2419 is positioned on the lower rear side of the feeder attachment unit 2417A, and supports a first reel holder 2419A and a second reel holder 2419B that rotatably support the reel 2420 in a state where they are vertically separated from each other. The component storage tape 243 is wound around the reel 2420 supported by each of the first reel holder 2419A and the second reel holder 2419B.

The AF 241 includes a feeder main body 2411. The AF 241 is fixed to the fixed base 2417C with the feeder main body 2411 inserted (set) in the slot 2417B. The feeder main body 2411 rotatably supports the first sprocket 2412A constituting a first tape feeding unit 2412 and the second sprocket 2413A constituting a second tape feeding unit 2413 which is separated in the Y-axis direction away from the reel support unit 2419 with respect to the first sprocket 2412A. The first sprocket 2412A and the second sprocket 2413A each includes a plurality of tooth portions arranged at predetermined intervals in the circumferential direction. The tooth portions of the first sprocket 2412A and the second sprocket 2413A can be fitted to the conveying force transmission holes 2432 formed on the carrier tape 2431 of the component storage tape 243.

The component storage tape 243 wound around the reel 2420 supported by each of the first reel holder 2419A and the second reel holder 2419B is guided to the first sprocket 2412A and the second sprocket 2413A while being guided by a guide roller 2418 provided at an upper end of the reel support unit 2419. The component storage tape 243 having the conveying force transmission hole 2432 fitted to the tooth portions of the first sprocket 2412A and the second sprocket 2413A is sent out by the rotation of the first sprocket 2412A and the second sprocket 2413A, and the component E is taken out at a component supply position P1.

The AF 241 further includes a tape support member 2414 detachably fixed to a rear end portion of the feeder main body 2411, an operation input unit 2415 disposed on an upper rear surface of the feeder main body 2411, and first and second tape detection sensors 2416A and 2416B.

As shown in FIG. 3, the tape support member 2414 divides a rear end portion of a tape travelling path 2414A on which the component storage tape 243 travels inside the feeder main body 2411 into two, upper and lower paths (an upper side path 2414AA and a lower side path 2414AB), and also supports the component storage tape 243 that passes through the upper side path 2414AA from below. More specifically, the rear end portion of the tape travelling path 2414A has a shape that spreads in the vertical direction from the front to the rear. The tape support member 2414 is inserted into the tape travelling path 2414A from the rear of the feeder main body 2411 and is detachably fixed to the feeder main body 2411. In this manner, the rear end portion of the tape travelling path 2414A is divided into the upper side path 2414AA and the lower side path 2414AB by the tape support member 2414.

The first tape detection sensor 2416A and the second tape detection sensor 2416B are provided so as to face the tape travelling path 2414A and detect the presence or absence of the component storage tape 243 passing through the tape travelling path 2414A. More specifically, the first tape detection sensor 2416A is provided in front of a merging point of the upper side path 2414AA and the lower side path 2414AB and at a position facing the tape travelling path 2414A from below. On the other hand, the second tape detection sensor 2416B is provided at a position facing the upper side path 2414AA from above, and, in this manner, detects the presence or absence of the component storage tape 243 in the upper side path 2414AA.

The operation input unit 2415 is used by the operator to send out and reversely send the component storage tape 243 as necessary.

Figure 7:
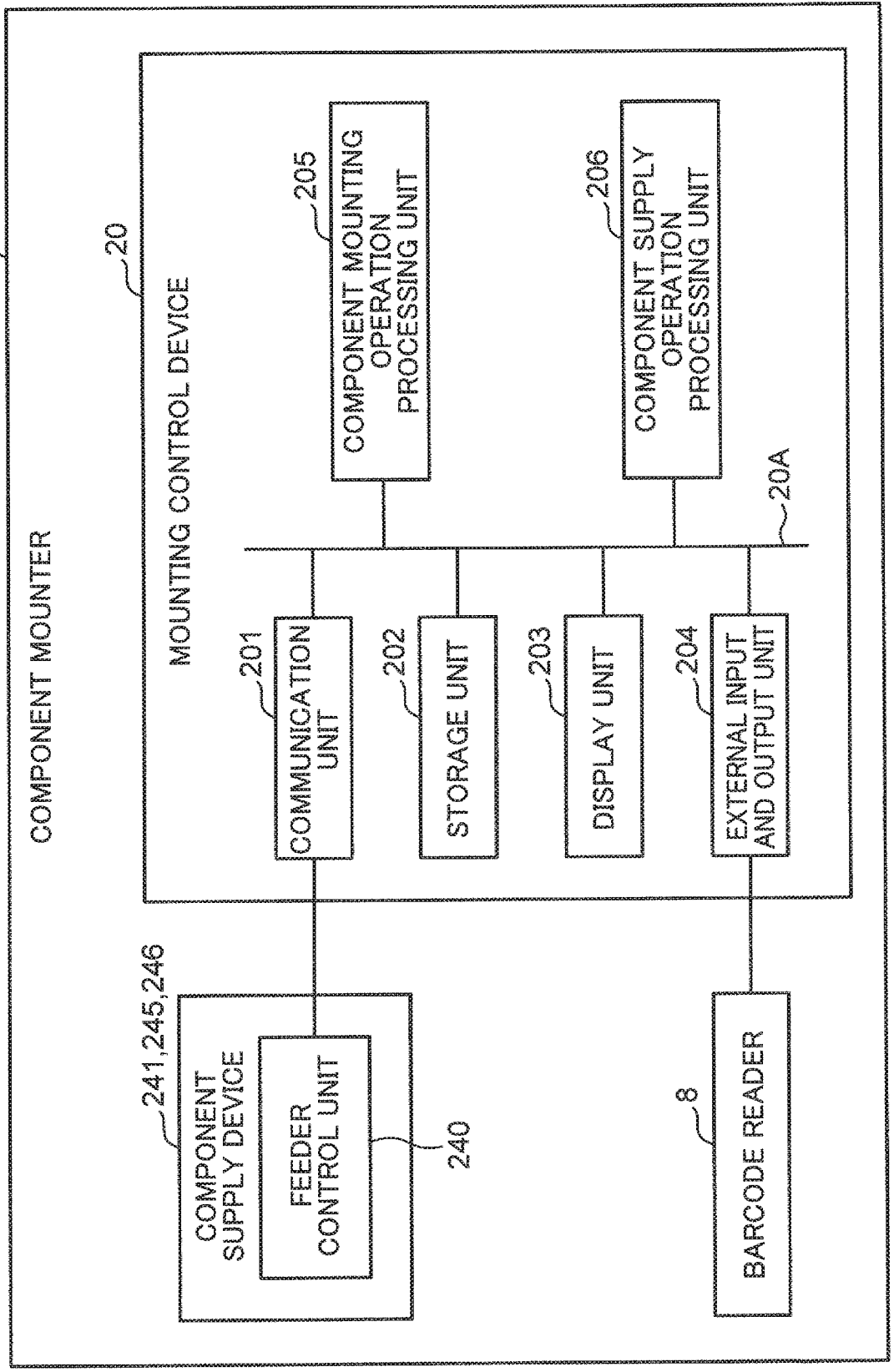
FIG. 7 is a block diagram showing a control system of the component mounter.

A component supply operation of the AF 241 configured as above is as described below. First, as a preparatory work, an operator attaches the reel 2420, around which the preceding component storage tape 243 is wound, to the first reel holder 2419A on a lower stage of the reel support unit 2419. At this time, the operator performs a reading operation of reading a component type identifying barcode BR (recording portion, see FIG. 3) provided on the reel 2420 with a barcode reader 8 (FIG. 7). The component type identifying barcode BR is obtained by encoding and recording replenishment component type information or the like for identifying a component type of the component E stored in the component storage tape 243 wound around the reel 2420.

The operator inserts a front end portion of the component storage tape 243 wound around the reel 2420 attached to the first reel holder 2419A into the upper side path 2414AA from the rear of the feeder main body 2411. In this manner, the front end portion of the preceding component storage tape 243 is supported by the tape support member 2414 in a state of being fitted to the first sprocket 2412A. Thereafter, the operator operates the operation input unit 2415 to input an instruction to rotate the first sprocket 2412A, send out the component storage tape 243, and fit the front end portion of the storage tape 243 to the second sprocket 2413A.

The component supply operation of the AF 241 is started in a state where the above-mentioned preparation work is finished. In the AF 241, the second sprocket 2413A rotates, which causes the component storage tape 243 to be sent out. Note that the first sprocket 2412A is configured to idle, and, at this time, the component storage tape 243 can be sent out only by rotation of the second sprocket 2413A.

Next, the operator removes the tape support member 2414 from the feeder main body 2411 in a state where the preceding component storage tape 243 is being sent out from the reel 2420. When the tape support member 2414 is removed, the component storage tape 243 is displaced to a bottom surface portion of the tape travelling path 2414A by its own weight. In this manner, the fitting of the preceding component storage tape 243 to the first sprocket 2412A is released. At this time, since the component storage tape 243 is fitted to the second sprocket 2413A, even if the fitting to the first sprocket 2412A is released, the component storage tape 243 continues to be sent out by the rotation of the second sprocket 2413A.

Next, in a state where the preceding component storage tape 243 is being sent out from the reel 2420, the operator mounts the tape support member 2414 on the feeder main body 2411 and moves the reel 2420, around which the preceding component storage tape 243 is wound, from the first reel holder 2419A on the lower stage to the second reel holder 2419B on the upper stage. Next, in a state where the preceding component storage tape 243 is being sent out from the reel 2420 supported by the second reel holder 2419B on the upper stage, the operator attaches the reel 2420, around which the subsequent component storage tape 243 is wound, to the first reel holder 2419A on the lower stage, and inserts a front end portion of the component storage tape 243 into the upper side path 2414AA from the rear of the feeder main body 2411. In this manner, the front end portion of the subsequent component storage tape 243 is supported by the tape support member 2414 in a state of being fitted to the first sprocket 2412A. In this manner, the reel 2420 around which the subsequent component storage tape 243 is wound can be mounted in a state where the preceding component storage tape 243 wound around the reel 2420 does not run out of the component. Note that, even when mounting the reel 2420 around which the subsequent component storage tape 243 is wound, the operator performs the reading operation of reading the component type identifying barcode BR provided on the reel 2420 with the barcode reader 8 (FIG. 7), similar to in the case of the preceding component storage tape 243.

Thereafter, all the preceding component storage tape 243 is pulled out from the reel 2420 supported by the second reel holder 2419B on the upper stage, and its rear end passes through the position of the second tape detection sensor 2416B. When the absence of the preceding component storage tape 243 is detected, sending out of the subsequent component storage tape 243 from the reel 2420 supported by the first reel holder 2419A on the lower stage is automatically started. Then, the operator removes the reel 2420 that has run out of the component from the second reel holder 2419B on the upper stage, and moves the reel 2420, around which the subsequent component storage tape 243 is wound, from the first reel holder 2419A on the lower stage to the second reel holder 2419B on the upper stage. At this time, the operator can replenish the AF 241 with a new reel around which the component storage tape 243 is wound. The new reel with which the AF 241 is replenished is attached to the first reel holder 2419A on the lower stage by the operator. Also at this time, the operator performs the reading operation of reading the component type identifying barcode provided on the new reel with the barcode reader 8. Here, the timing of the component replenishment work with the new reel is identified by the component replenishment management system 3 without being restricted to a time point at which the reel 2420, around which the preceding component storage tape 243 is wound, runs out of the component.

Note that, in a state where the preceding component storage tape 243 is sent out from the reel 2420 supported by the second reel holder 2419B on the upper stage, and a front end portion of the subsequent component storage tape 243 wound around the reel 2420 supported by the first reel holder 2419A on the lower stage is inserted in the upper side path 2414AA, a new reel cannot be mounted. On the other hand, in a state where all the preceding component storage tape 243 is pulled out from the reel 2420 supported by the second reel holder 2419B on the upper stage, and sending out of the subsequent component storage tape 243 from the reel 2420 supported by the first reel holder 2419A on the lower stage is automatically started, a new reel can be mounted.

(Tray Feeder)

Figure 5:
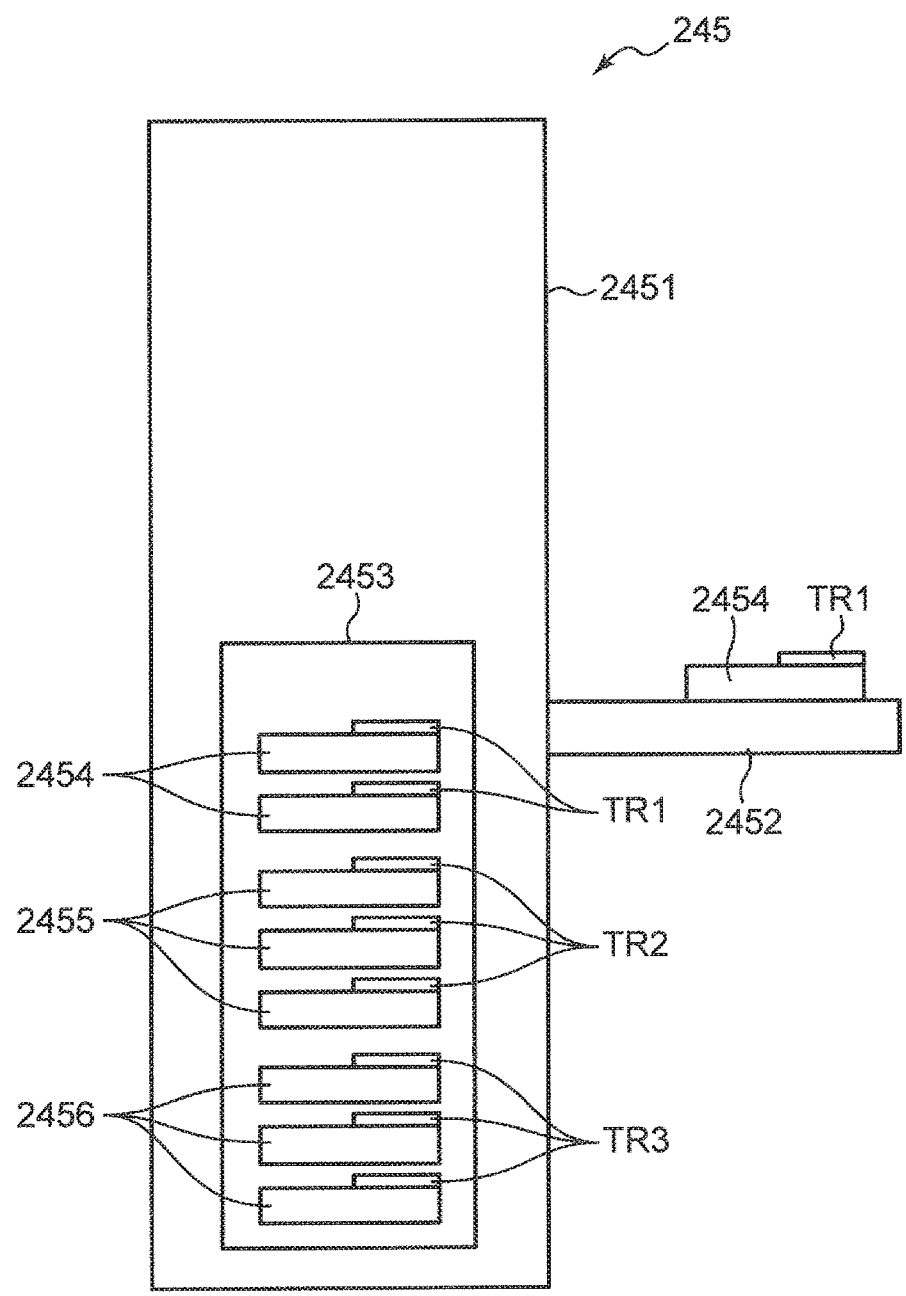
FIG. 5 is a diagram schematically showing a tray feeder as the component supply device disposed in the component supply unit of the component mounter.

Next, the tray feeder as the component supply device will be described with reference to FIG. 5. FIG. 5 is a diagram schematically showing a configuration of a tray feeder 245. A plurality of tray feeders 245 can be installed side by side in the component supply unit 24. The tray feeder 245 is configured such that one magazine 2453 can move vertically in a cover body 2451. The magazine 2453 accommodates a plurality of first pallets 2454, a plurality of second pallets 2455, and a plurality of third pallets 2456.

At least one first tray TR1 holding a plurality of components is placed on each of the first pallets 2454. The components held in the first tray TR1 are the same type of the components for each of the first pallets 2454. Similarly, at least one second tray TR2 holding a plurality of components is placed on each of the second pallets 2455. The components held in the second tray TR2 are the same type of the components for each of the second pallets 2455. However, the type of the component held on the second tray TR2 is different from that of the component held on the first tray TR1. Further, at least one third tray TR3 holding a plurality of components is placed on each of the third pallets 2456. The components held in the third tray TR3 are the same type of the components for each of the third pallets 2456. However, the type of the component held on the third tray TR3 is different from that of the component held on each of the first tray TR1 and the second tray TR2.

Each of the first pallet 2454, the second pallet 2455, and the third pallet 2456 has a function as the component storage member on which the tray TR1, TR2, or TR3 holding a plurality of components is placed. Each of the first pallet 2454, the second pallet 2455, and the third pallet 2456 housed in the magazine 2453 is moved to a table 2452 that is provided so as to project outward from the cover body 2451 during production of the component mounting substrate, and, in this manner, the components are supplied in a state of being held by the trays TR1, TR2, and TR3.

During the production of the component mounting substrate, even if the component held in the first tray TR1 placed on one of the plurality of first pallets 2454 runs out, another first pallet 2454 is moved to the table 2452, and, in this manner, the component is supplied in a state of being held by the first tray TR1. At this time, the operator can take out the first pallet 2454 that has run out of the component from the cover body 2451 and replenish the tray feeder 245 with a new first pallet during the production of the component mounting substrate. Similarly, during the production of the component mounting substrate, even if the component held in the second tray TR2 placed on one of the plurality of second pallets 2455 runs out, another second pallet 2455 is moved to the table 2452, and, in this manner, the component is supplied in a state of being held by the second tray TR2. At this time, the operator can take out the second pallet 2455 that has run out of the component from the cover body 2451 and replenish the tray feeder 245 with a new second pallet during the production of the component mounting substrate. Further, during the production of the component mounting substrate, even if the component held in the third tray TR3 placed on one of the plurality of third pallets 2456 runs out, another third pallet 2456 is moved to the table 2452, and, in this manner, the component is supplied in a state of being held by the third tray TR3. At this time, the operator can take out the third pallet 2456 that has run out of the component from the cover body 2451 and replenish the tray feeder 245 with a new third pallet during the production of the component mounting substrate.

Note that, when replenishing the tray feeder 245 with a new pallet, the operator performs a reading operation of reading a component type identifying barcode provided on the new pallet with the barcode reader 8. The component replenishment management system 3 performs management regarding a plan of component replenishment work for the tray feeder 245 with a new pallet.

(Stick Feeder)

Figure 6:
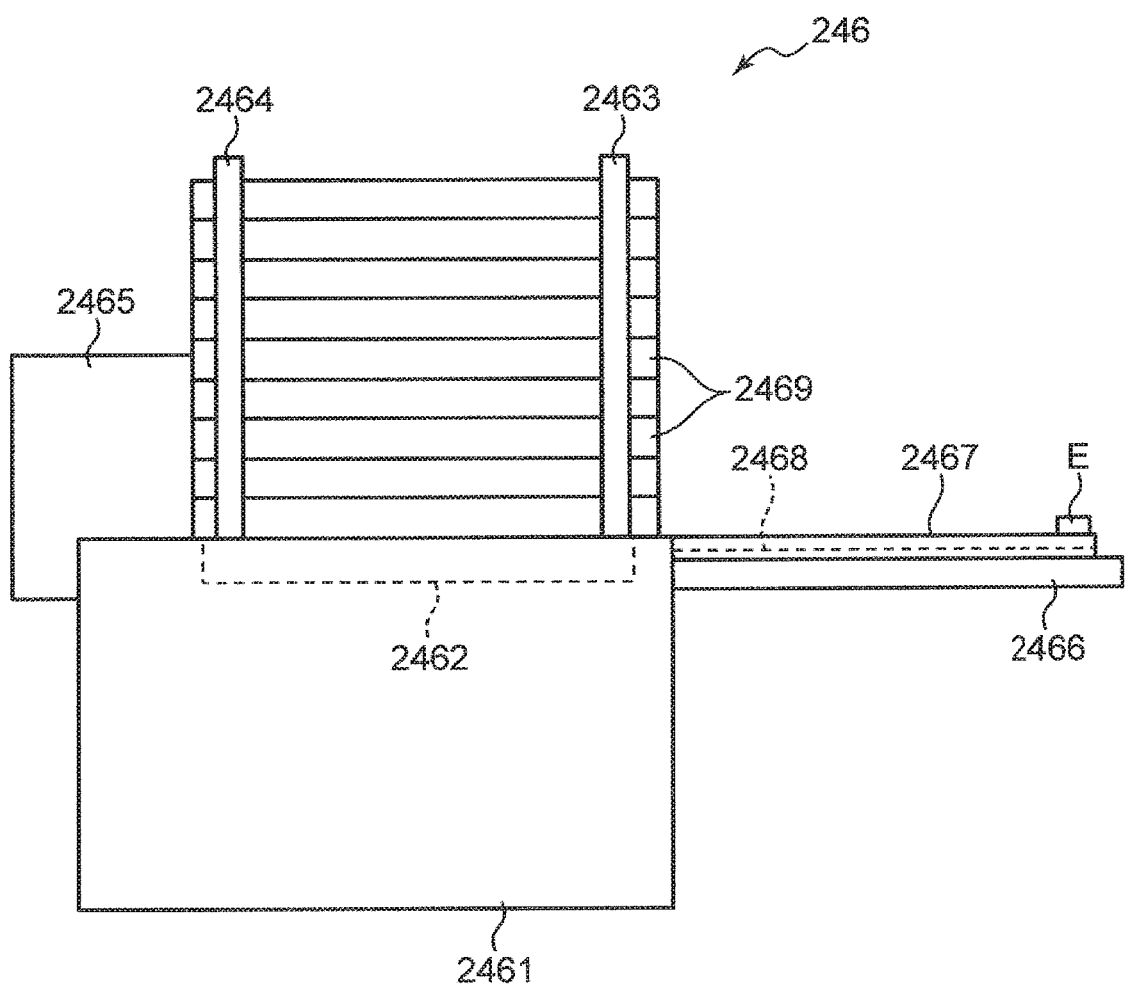
FIG. 6 is a diagram schematically showing a stick feeder as the component supply device disposed in the component supply unit of the component mounter.

Next, a stick feeder as the component supply device will be described with reference to FIG. 6. FIG. 6 is a diagram schematically showing a configuration of the stick feeder 246. A plurality of stick feeders 246 can be provided side by side in the component supply unit 24. The stick feeder 246 is configured to supply the component E stored in a stick 2469 as a cylindrical component storage member while pushing the component E out from the stick 2469. The stick feeder 246 includes a frame main body 2461, a stick table 2462 provided in an upper portion of the frame main body 2461, a first chuck 2463 and a second chuck 2464, a component pushing-out mechanism unit 2465, a guide frame 2466, a pair of guide rails 2467, and a conveyor belt 2468.

The frame main body 2461 has a hollow box shape with an open top. The stick table 2462 is arranged on an inner side of the upper portion of the frame main body 2461. A plurality of sticks 2469 can be placed in a stacked state on the stick table 2462. The first chuck 2463 can simultaneously hold front end portions of the sticks 2469 other than the lowest one of the plurality of sticks 2469 on the stick table 2462. Similarly, the second chuck 2464 can simultaneously hold rear end portions of the sticks 2469 other than the lowest one of the plurality of sticks 2469 on the stick table 2462.

The component pushing-out mechanism unit 2465 pushes the component E forward from the lowest stick 2469 of the plurality of sticks 2469 on the stick table 2462. The guide frame 2466 is fixed to a front portion of the frame main body 2461, and a pair of guide rails 2467 are supported by the guide frame 2466. Then, the conveyor belt 2468 is provided between the pair of guide rails 2467. The component E pushed forward by the component pushing-out mechanism unit 2465 is conveyed by the conveyor belt 2468 along the pair of guide rails 2467. In this manner, the component E stored in the stick 2469 is supplied to the component supply position.

When the lowest stick 2469 runs out of the component due to the component supply operation, the first and second chucks 2463 and 2464 hold the sticks 2469 other than the lowest stick 2469. In this state, the stick table 2462 is displaced to a support releasing position for releasing the support of the stick 2469, so that only the lowest stick 2469 is dropped to an inner bottom portion of the frame main body 2461 by its own weight. Note that, after the stick 2469 that has run out of the component is discarded, the stick table 2462 returns to the support position of the stick 2469, and the first and second chucks 2463 and 2464 are opened, so that the remaining sticks 2469 are placed on the stick table 2462, and the component E is supplied from the next (lowest) stick 2469.

During production of the component mounting substrate, when the stick 2469 that has run out of the component drops on the inner bottom portion of the frame main body 2461, the operator can replenish the stick feeder 246 with a new stick. Note that, when replenishing the stick feeder 246 with a new stick, the operator performs a reading operation of reading a component type identifying barcode provided on the new stick with the barcode reader 8.

The component replenishment management system 3 performs management regarding a plan of component replenishment work for the stick feeder 246 with a new stick.

<Control System of Component Mounter>

A control system of the component mounter 2 will be described with reference to a block diagram of FIG. 7. The component mounter 2 includes the mounting control device 20. The mounting control device 20 is a device that integrally controls the component mounting operation of the component mounter 2 and also controls the operation of the component supply devices including the AF 241, the tray feeder 245, and the stick feeder 246. The mounting control device 20 includes, for example, a microcomputer incorporating a storage device such as a read only memory (ROM) that stores a control program, a flash memory that temporarily stores data, or the like, and controls the component mounting operation of the component mounter 2 and the operation of the component supply device by reading the control program. The mounting control device 20 includes a communication unit 201, a memory unit 202, a display unit 203, an external input and output unit 204, a component mounting operation processing unit 205, and a component supply operation processing unit 206, which are connected via a bus 20A.

The communication unit 201 is an interface for data communication with the component supply device and the component replenishment management system 3. All the component supply devices disposed in each of the component supply units 24 of the component mounter 2 are connected to the communication unit 201. The external input and output unit 204 is an interface for data communication with the barcode reader 8.

The memory unit 202 stores attachment information JH1 shown in FIG. 8. The attachment information JH1 is information on the component in the component supply device disposed in each of the component supply units 24 of the component mounter 2. The attachment information JH1 associates mounter type information J11, set position information J12, device type information J13, component type information J14, preceding component remaining number information J15, total component remaining number information J16, component remaining number warning value information J17, and component remaining number stop value information J18 with each other. The mounter type information J11 is information for identifying the component mounter 2. The set position information J12 is information indicating a position within the component supply unit 24 of the component supply device. In a case where the component supply device is the AF 241, the set position information J12 is information identified by a position of the slot 2417B in the feeder attachment unit 2417A. Slot numbers different from each other are assigned to the slots 2417B, and the position of each of the slots 2417B, that is, a set position is identified by this slot number. The device type information J13 is information indicating a type of the component supply device (type of a component supply system).

The component type information J14 is information for identifying a component type of the component supplied by each of the component supply devices, and is indicated by identification information for identifying the component, component name information indicating the name of the component, or the like. The preceding component remaining number information J15 is information indicating the remaining number of components of the preceding component storage member in each of the component supply devices. The total component remaining number information J16 is information indicating the total number of remaining components in each of the component supply devices. The component remaining number warning value information J17 is information indicating that the total number of remaining components represented by the total component remaining number information J16, before the component runs out in each component supply device, has a predetermined value (component remaining number warning value) for which a warning needs to be issued. The component remaining number stop value information J18 is information that is particularly applied to the splicing feeder, and information indicating that the total number of remaining components represented by the total component remaining number information J16 has a predetermined value (component remaining number stop value) for which sending out of the tape for the splicing work needs to be stopped. In the splicing feeder, the splicing work to join tapes for replenishment cannot be performed even if the sending out of a preceding component storage tape is stopped after the remaining number of components in the preceding component storage tape becomes "0: zero". For this reason, in the splicing feeder, the component remaining number stop value represented by the component remaining number stop value information J18 is normally preferably set to a value larger than "0: zero". Unlike the splicing feeder, the AF 241, the tray feeder 245, and the stick feeder 246 do not have the concept of "a predetermined value for which sending out of the tape feeding needs to be stopped for the splicing work". Therefore, in the AF 241, the tray feeder 245, and the stick feeder 246, the component remaining number stop value represented by the component remaining number stop value information J18 is normally preferably set to "0: zero" which is when the component actually runs out, or to a value smaller than the component remaining number warning value.

The display unit 203 displays information or the like received by the communication unit 201 and transmitted from the component replenishment management system 3 described later. The component mounting operation processing unit 205 controls the operation of the head unit 25 and the like in the production of the component mounting substrate by the component mounter 2. The component supply operation processing unit 206 performs processing of integrally controlling the operation of each of the component supply devices by transmitting a control signal to a feeder control unit 240 of each of the component supply devices via the communication unit 201.

Note that, as shown in FIG. 2, a work area WA in which the component replenishment work is performed by an operator is set in the component mounter 2. In the present embodiment, the work area WA including the component supply unit 24 disposed on the −Y side of the component mounter 2 and the work area WA including the component supply unit 24 disposed on the +Y side of the component mounter 2 are set in the component mounter 2. In the component mounting line 2L in which a plurality of component mounters 2 are connected, the work areas WA positioned on the −Y side of the component mounters 2 are disposed side by side in the X-axis direction, and the work areas WA positioned on the +Y side of the component mounters 2 are disposed side by side in the X-axis direction. Hereinafter, in the component mounting line 2L, the arrangement of the work areas WA positioned on the −Y side of the component mounters 2 and the arrangement of the work areas WA positioned on the +Y side of the component mounters 2 will be referred to as "lanes".

[Configuration of Component Replenishment Management System]

The component replenishment management system 3 is a system that manages a plan of the component replenishment work to be performed by the operator in accordance with the production of the component mounting substrate in the work area WA set in each of the component mounters 2. The component replenishment work includes new reel replenishment work for the AF 241, new pallet replenishment work for the tray feeder 245, new stick replenishment work for the stick feeder 246, and splicing work for the splicing feeder.

Figure 9:
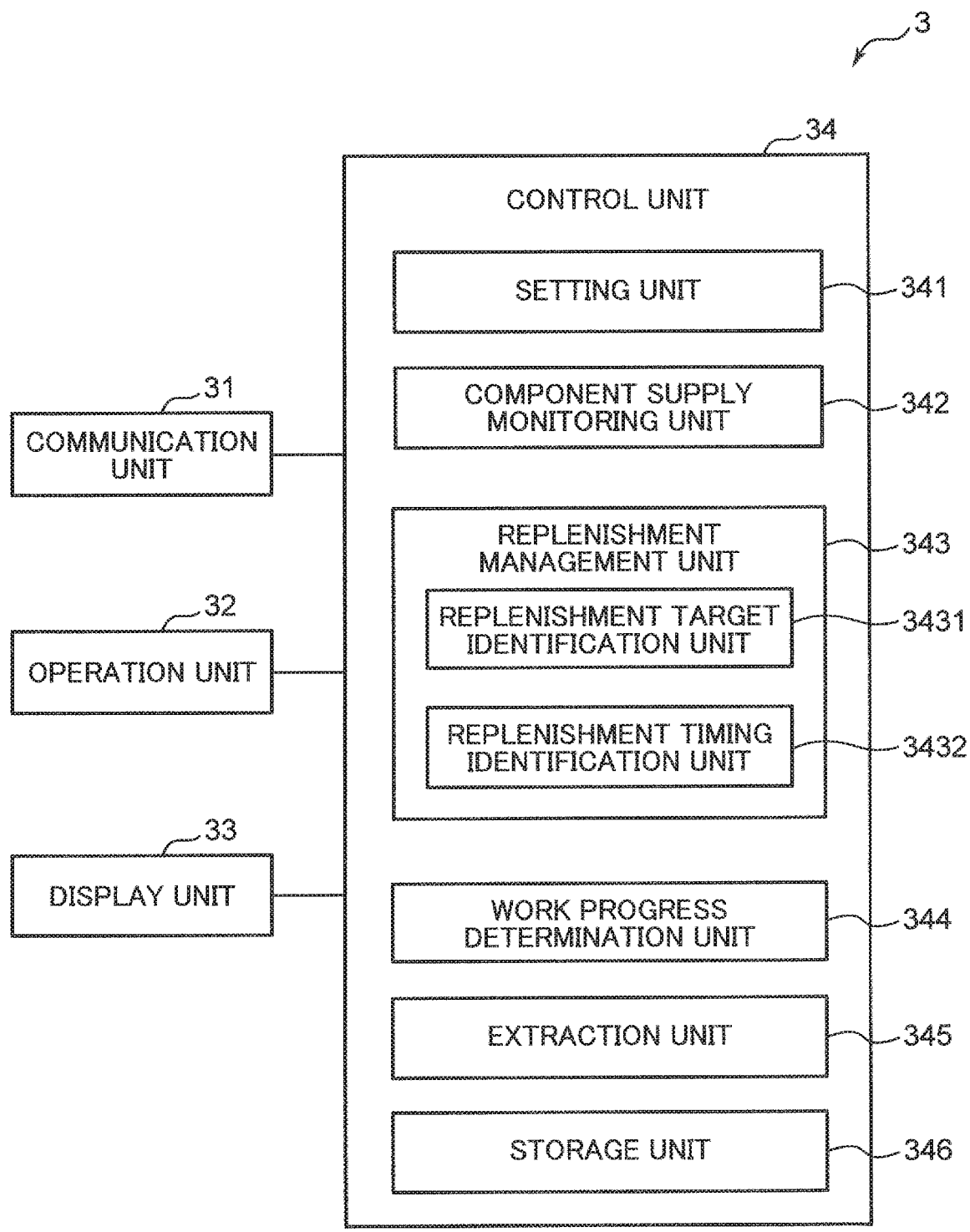
FIG. 9 is a block diagram showing a configuration of a component replenishment management system.

FIG. 9 is a block diagram showing a configuration of the component replenishment management system 3. As shown in FIG. 1, the component replenishment management system 3 is connected to the mounting control device 20 of each of the component mounters 2, the production plan management device 4, the substrate information management device 5, and the mobile terminal device 7 carried by the operator in a data communicable manner. Further, the component replenishment management system 3 includes, for example, a microcomputer, and includes a communication unit 31, an operation unit 32, a display unit 33, and a control unit 34, as shown in FIG. 9.

The operation unit 32 includes a touch panel, a numeric keypad, a start key, a setting key, and the like, and receives operation of the operator and various settings on the component replenishment management system 3. The display unit 33 displays component replenishment management information generated by a replenishment management unit 343 of the control unit 34 which will be described later, and updated by a work progress determination unit 344 and an extraction unit 345. The communication unit 31 is an interface for realizing data communication with the mounting control device 20 of each of the component mounters 2, the production plan management device 4, the substrate information management device 5, and the mobile terminal device 7. The communication unit 31 acquires information transmitted from the mounting control device 20 of each of the component mounters 2, the production plan management device 4, the substrate information management device 5, and the mobile terminal device 7, and provides the acquired information to the control unit 34. Further, the communication unit 31 is provided with the component replenishment management information, generated by the replenishment management unit 343 and updated by the work progress determination unit 344 and the extraction unit 345, from the control unit 34, and transmits (outputs) the component replenishment management information to the mounting control device 20 of each of the component mounters 2 and the mobile terminal device 7.

Here, the production plan management device 4 and the substrate information management device 5, which are connected to the component replenishment management system 3 in a data communicable manner, will be described. The production plan management device 4 is a device for managing the production plan of the component mounting substrate by each of the component mounters 2. The production plan management device 4 includes, for example, a microcomputer. The production plan management device 4 transmits production plan information regarding the production plan of the component mounting substrate to the component replenishment management system 3 by the operation by the operator who makes the production plan. FIG. 10 is a diagram for describing production plan information JH2 transmitted from the production plan management device 4 and input to the component replenishment management system 3. The production plan information JH2 is information in which production order information J21, substrate type information J22, production quantity information J23, and cycle time information J24 are associated. The production order information J21 is information indicating the production order of the component mounting substrate. The substrate type information J22 is information indicating a type of the substrate P used for the production of the component mounting substrate. The production quantity information J23 is information indicating the production quantity of the component mounting substrate for each substrate type. The cycle time information J24 is information indicating the time (second/sheet) required to finish one component mounting substrate when the component is mounted on the substrate P.

Figure 11:
FIG. 11 is a diagram for describing substrate information input to the component replenishment management system.

The substrate information management device 5 is a device for managing substrate information that is referred to at the time of the production of the component mounting substrate by each of the component mounters 2. The substrate information management device 5 includes, for example, a microcomputer. The substrate information management device 5 transmits the substrate information to the component replenishment management system 3 by the operation of the operator. FIG. 11 is a diagram for describing substrate information JH3 transmitted from the substrate information management device 5 and input to the component replenishment management system 3. The substrate information JH3 is information in which the substrate type information J22, the set position information J12, the component type information J14, and component required number information J31 are associated. The component required number information J31 is information regarding the required number (number/sheet) of the components necessary for production of one component mounting substrate. The substrate information JH3 is rewritten every time a type of the substrate P indicated by the substrate type information J22 is switched.

The substrate information JH3 is transmitted to the mounting control device 20 of each of the component mounters 2 via the component replenishment management system 3 and is referred to at the time of production of the component mounting substrate by each of the component mounters 2. Specifically, the component mounting operation processing unit 205 of the mounting control device 20 controls the operation of the head unit 25 and the like based on the substrate information JH3 in the production of the component mounting substrate by the component mounter 2. In the substrate information JH3, at the time of production of the substrate type indicated by the substrate type information J22, when the component is supplied by the component supply device disposed at the set position indicated by the set position information J12, the head unit 25 is controlled to take out the component indicated by the component type information J14 from the component supply device. The substrate information management device 5 stores the substrate information JH3 of the substrate type currently produced. In other words, when the substrate information JH3 stored in the substrate information management device 5 is transmitted to the mounting control device 20 via the component replenishment management system 3, the component mounting substrate is produced based on the substrate information JH3. Therefore, in order to produce a substrate of a next substrate type after the production of the substrate of the substrate type of the current substrate information JH3 is finished, the substrate information JH3 of the next substrate type must be stored in the substrate information management device 5.

The control unit 34 of the component replenishment management system 3 includes a central processing unit (CPU), a read only memory (ROM) that stores a control program, a random access memory (RAM) used as a work area of the CPU, and the like. The control unit 34 controls the communication unit 31, the operation unit 32, and the display unit 33 as the CPU executes the control program stored in the ROM, and also generates various types of information regarding the management of the plan of the component replenishment work. As shown in FIG. 9, the control unit 34 includes a setting unit 341, a component supply monitoring unit 342, the replenishment management unit 343, the work progress determination unit 344, the extraction unit 345, and a memory unit 346.

Figure 14:
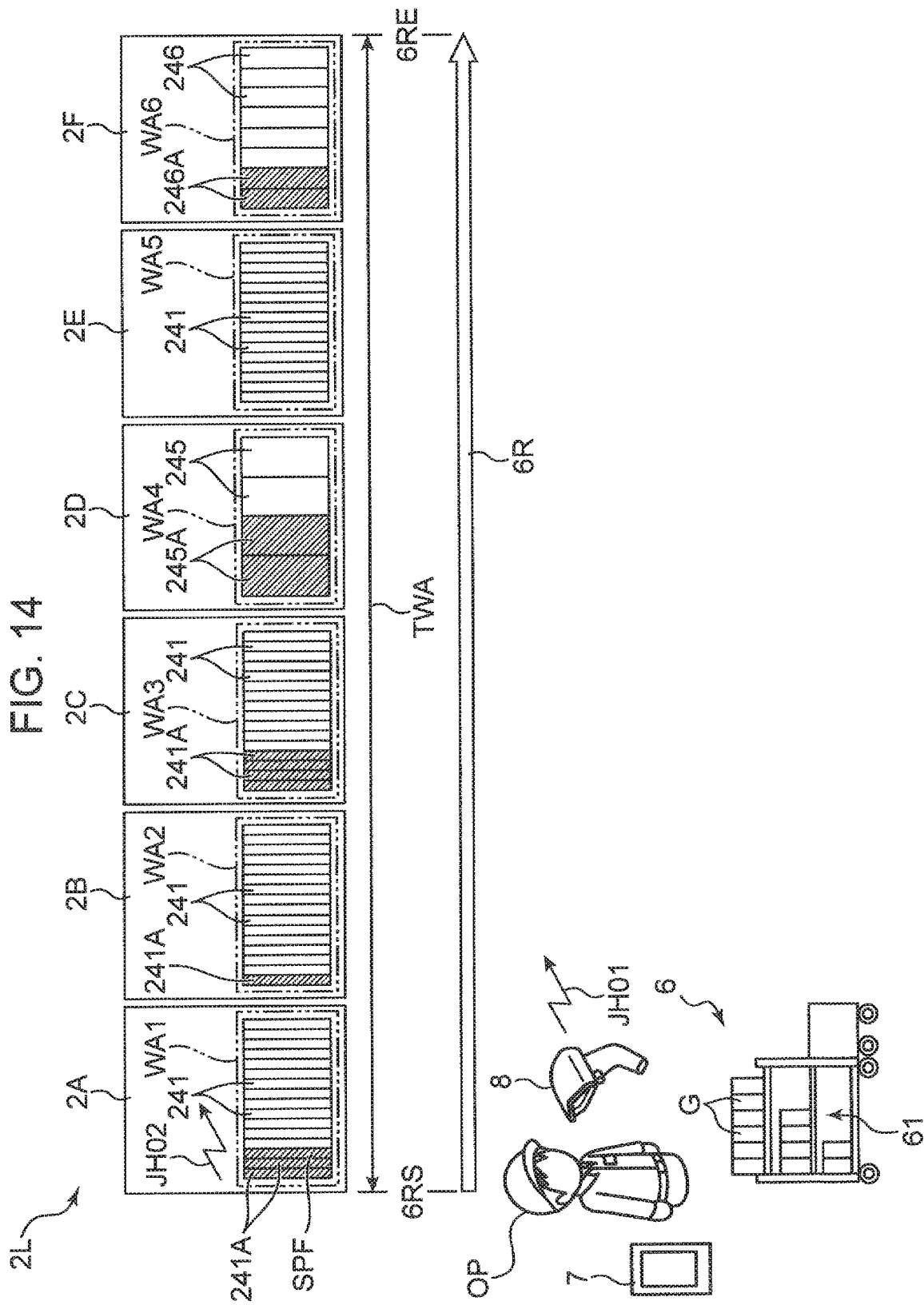
FIG. 14 is a diagram for describing operation of the component replenishment management system.

With reference to FIG. 12 to FIG. 17 in addition to FIG. 9, the setting unit 341, the component supply monitoring unit 342, the replenishment management unit 343, the work progress determination unit 344, the extraction unit 345, and the memory unit 346 in the control unit 34 will be described. FIG. 12 is a diagram for describing the control operation of the component supply monitoring unit 342 and the replenishment management unit 343. FIG. 13 is a diagram for describing component replenishment management information JH4 generated by the replenishment management unit 343 and the work progress determination unit 344. FIG. 14 is a diagram for describing the operation of the component replenishment management system 3. FIG. 15 is a diagram for describing the component replenishment management information JH4 to which information regarding the extraction operation by the extraction unit 345 is added. FIGS. 16 and 17 are diagrams for describing the component replenishment management information JH4 to which an extraction result of the extraction unit 345 is added.

<Regarding Setting Unit>

As shown in FIG. 14, a work area TWA is set on the component mounting line 2L. The work area TWA represents a range in which one operator OP is in charge of the component replenishment work for the component supply device attached to each of the component mounters 2 of the component mounting line 2L. The work area TWA includes the work area WA set in the component mounter 2 disposed in the work area TWA. In a case where the component mounters 2 for which the operator OP is in charge of the component replenishment work are placed on a plurality of component mounting lines 2L, the work area TWA includes the plurality of component mounting lines 2L.

The operator OP carries the mobile terminal device 7, moves on a movement route 6R along the component mounting line 2L that passes through the work area WA of each of the component mounters 2 while pushing a cart 6 in the work area TWA, and performs the component replenishment work in each of the work areas WA. Note that the cart 6 has a cargo portion 61 capable of accommodating an article G for the component replenishment work. The articles G accommodated in the cargo portion 61 include a new component storage member (reel, pallet, or stick) necessary for the component replenishment work, a collected product recovered after the component replenishment work, and the like. Further, the cart 6 may be unmanned transported by using an automated guided vehicle (AGV) which is an unmanned guided vehicle. In this case, AGV instruction data created based on the component replenishment management information JH4 described later is distributed to the AGV. The AGV instruction data is a file in which a position of the work area WA at which the AGV should stop and stop time are described. In the work area TWA, the AGV sequentially moves to and stops at each of the work areas WA along the movement route 6R so as to guide the operator OP. In this manner, the operator OP can move along the movement route 6R with the AGV as a mark, and perform the component replenishment work in the work area WA at the position where the AGV is stopped.

Note that, in the example shown in FIG. 14, in the work area TWA, the component mounters 2 of the component mounting line 2L are shown as a first component mounter 2A, a second component mounter 2B, a third component mounter 2C, a fourth component mounter 2D, a fifth component mounter 2E, and a sixth component mounter 2F in order from the upstream side to the downstream side of the movement route 6R. Further, the work area set in the first component mounter 2A is shown as a first work area WA1, and, similarly, the work area of the second component mounter 2B is shown as a second work area WA2, the work area of the third component mounter 2C is shown as a third work area WA3, the work area of the fourth component mounter 2D is shown as a fourth work area WA4, the work area of the fifth component mounter 2E is shown as a fifth work area WA5, and the work area of the sixth component mounter 2F is shown as a sixth work area WA6.

The setting unit 341 sets work allowable time of the operator OP in the work area TWA set in the component mounting line 2L. The work allowable time shows time allowed as the time required from the start of the component replenishment work to the completion when the operator OP performs the component replenishment work while moving on one of the movement routes 6R in the work area TWA. A start time of the component replenishment work by the operator OP in the work area TWA may be, for example, a time point at which notification information notifying the start of the work is input to the component replenishment management system 3 via the communication unit 31 by the operation of the operator OP on the mobile terminal device 7 or the like, or may be an earliest time (earliest time) of an overlapping replenishment time zone (TWD1, TWD2, and TWD3 in FIG. 12) set by a replenishment target identification unit 3431 of the replenishment management unit 343 described later. Further, the work allowable time may be set so as to represent time during which the operator OP is allowed to stay in the work area TWA when the operator OP performs the component replenishment work in the work area TWA. More specifically, the work allowable time represents time allowed from a start point 6RS to an end point 6RE of the movement route 6R in the work area TWA for the operator OP who performs the component replenishment work while moving on the movement route 6R along the component mounting line 2L. Note that, in a case where the work area TWA is set to include the plurality of component mounting lines 2L, the work allowable time represents time allowed from the start point 6RS to the end point 6RE of the entire movement route 6R across the plurality of component mounting lines 2L. Further, the movement route 6R in the work area TWA is a route set to pass through the work area WA in which the component supply device as a target of the component replenishment work is disposed in the work area WA disposed on the −Y side and the +Y side of each of the component mounters 2 in each of the component mounting lines 2L, and is not limited to the route along the component mounting line 2L as shown in FIG. 14. For example, a route that passes in a zigzag manner between the work area WA disposed on the −Y side of each of the component mounters 2 and the work area WA disposed on the +Y side may be set as the movement route 6R, and in some cases, a route that passes in one direction and then returns may be set as the movement route 6R.

The setting unit 341 may set predetermined time as the work allowable time, or may set a value input via the operation unit 32 as the work allowable time. Alternatively, the setting unit 341 may set the work allowable time such that the most late time (latest time) of the overlapping replenishment time zone set by the replenishment target identification unit 3431 described later becomes the end of the work allowable time. Alternatively, the setting unit 341 may set, as the work allowable time, specific time that defines a time interval of a specific period (TW11, TW12, and TW13 in FIG. 12) set by the replenishment target identification unit 3431 described later. Alternatively, the setting unit 341 may refer to work list information J4 included in the component replenishment management information JH4 (FIG. 13) generated by the replenishment target identification unit 3431 described later, and set, as the work allowable time, total time of work standard time indicated by work standard time information J50 with the same movement route number indicated by movement route number information J41. Further, the work allowable time set by the setting unit 341 may be appropriately changed by the operator OP according to a next work schedule or the like at the start of the work in the work area TWA. At this time, the operator OP may input a completion time of the work in the work area TWA.

<Regarding Component Supply Monitoring Unit>

The component supply monitoring unit 342 will be described mainly with reference to FIG. 12. FIG. 12 shows an example in which the component mounting substrate of a first substrate type is produced in a first production period TW01, and then the substrate type is switched and the component mounting substrate of a second substrate type is produced in a second production period TW02. Further, FIG. 12 shows an example in which, in the first production period TW01, the component is supplied from three AFs 241A1, 241A2, and 241A3, two tray feeders 245A1 and 245A2, and one stick feeder 246A1 among the plurality of component supply devices provided in each of the component mounters 2 of the component mounting line 2L to produce the component mounting substrate. The component replenishment work that the operator OP is to perform according to the production of the component mounting substrate includes the component replenishment work for replenishing each of the AFs 241A1, 241A2, and 241A3 with a new reel, the component replenishment work for replenishing each of the tray feeders 245A1 and 245A2 with a new pallet, and the component replenishment work for replenishing the stick feeder 246A1 with a new stick. The AFs 241A1, 241A2, and 241A3, the tray feeders 245A1 and 245A2, and the stick feeder 246A1 may be collectively referred to as the "component supply devices 241, 245, and 246", and a reel, a pallet, and a stick may be collectively referred to as the "component storage members".

First, the component supply monitoring unit 342 acquires a management start time TS indicating a management start time of a plan of the component replenishment work for each of the AFs 241A1, 241A2, and 241A3, the tray feeders 245A1 and 245A2, and the stick feeder 246A1. The component supply monitoring unit 342 may acquire a time to start the production of the component mounting substrate in the first production period TW01 as the management start time TS, or in a case where command information for instructing the management start is input via the operation unit 32, the component supply monitoring unit 342 may acquire a time at which the command information is input as the management start time TS.

Upon acquiring the management start time TS, the component supply monitoring unit 342 monitors a component replenishment status in each of the component supply devices 241, 245, and 246 from the management start time TS. The component supply monitoring unit 342 identifies a replenishable time zone that represents a time zone in which the component replenishment work can be performed for each of the component supply devices 241, 245, and 246. In the example shown in FIG. 12, a replenishable time zone TWSA is identified for the AF 241A1, a replenishable time zone TWSB is identified for the AF 241A2, and a replenishable time zone TWSC is identified for the AF 241A3. Further, a replenishable time zone TWSD is identified for the tray feeder 245A1, and a replenishable time zone TWSE is identified for the tray feeder 245A2. Furthermore, a replenishable time zone TWSF is identified for the stick feeder 246A1.

The most early time in each of the replenishable time zones TWSA to TWSF (hereinafter referred to as the "earliest time") is a time when a preceding component storage member, for which component supply is performed first, among the plurality of component storage members mounted in the component supply devices 241, 245, and 246 runs out of the component. When the preceding component storage member runs out of the component, a new component storage member can be replenished. Further, the most late time in each of the replenishable time zones TWSA to TWSF (hereinafter referred to as the "latest time") is a time when the total number of remaining components in the plurality of component storage members mounted in the component supply devices 241, 245, and 246 reaches the predetermined component remaining number warning value.

The component supply monitoring unit 342 identifies the replenishable time zones TWSA to TWSF for each of the component supply devices 241, 245, and 246 based on pieces of information provided from the communication unit 31 to the control unit 34, i.e., the attachment information JH1 from the mounting control device 20 of each of the component mounters 2, the production plan information JH2 from the production plan management device 4, and the substrate information JH3 from the substrate information management device 5.

Specifically, the component supply monitoring unit 342 first obtains the number of remaining components in the preceding component storage member based on the preceding component remaining number information J15 of the attachment information JH1. Furthermore, the component supply monitoring unit 342 obtains the number of components used per second by dividing a required number for each component identified by the component type information J14 necessary for the production of one component mounting substrate, which is represented by the component required number information J31 of the substrate information JH3 by time required to finish one component mounting substrate for each substrate identified by the substrate type information J22, which is represented by the cycle time information J24 of the production plan information JH2. Then, the component supply monitoring unit 342 obtains the earliest time in each of the replenishable time zones TWSA to TWSF by dividing the number of remaining components in the preceding component storage member by the number of components used per second. On the other hand, the component supply monitoring unit 342 obtains the latest time in each of the replenishable time zones TWSA to TWSF by dividing the number of components obtained by subtracting the component remaining number warning value represented by the component remaining number warning value information J17 from the total number of remaining components represented by the total component remaining number information J16 by the number of components used parts per second.

The number of remaining components in the preceding component storage member represented by the preceding component remaining number information J15 and the total number of remaining components represented by the total component remaining number information J16 are reduced every time the component is taken out by the head unit 25. Although details will be described later, every time the component is taken out from the preceding component storage member, the preceding component remaining number information J15 is updated. Further, when the preceding component storage member runs out of the component and the component supply devices 241, 245, and 246 are replenished with a new component storage member, the number of components stored in the new component storage member (initial setting number) is added to the total number of remaining components that changes every time the component is taken out by the head unit 25, so that the total number of remaining components is updated. The number of components stored in a new component storage member (initial setting number) is stored in the ROM or the like of the control unit 34 for each component identified by the component type information J14. In a case where the component storage member in use is used as a new component storage member for replenishment, the initial setting number stored in the ROM or the like of the control unit 34 is rewritten with an actual number of components stored in the component storage member.

The component supply monitoring unit 342 updates an identification result of the replenishable time zone TWSA to TWSF in a predetermined cycle (for example, a cycle of 30 seconds) in response to the update of the preceding component remaining number information J15 and the total component remaining number information J16. Further, the component supply monitoring unit 342 may be configured to identify the replenishable time zones TWSA to TWSF in the first production period TW01 of the first substrate type, or identify the replenishable time zones TWSA to TWSF in consideration of the production periods of the second and subsequent substrate types in addition to the first substrate type.

<Regarding Replenishment Management Unit>

Next, the replenishment management unit 343 manages a plan of the component replenishment work for each of the AFs 241A1, 241A2, and 241A3, the tray feeders 245A1 and 245A2, and the stick feeder 246A1 based on the replenishable time zones TWSA to TWSF identified by the component supply monitoring unit 342. As shown in FIG. 9, the replenishment management unit 343 includes a replenishment target identification unit 3431 and a replenishment timing identification unit 3432.

The replenishment target identification unit 3431 identifies the component supply device for which the component replenishment work can be performed as a component replenishment target device that is a target of the component replenishment work based on a supply state of the component in each of the component supply device 241, 245, and 246. Specifically, the replenishment target identification unit 3431 first recognizes an overlapping replenishment time zone in each of the replenishable time zones TWSA to TWSF. In the example shown in FIG. 12, the replenishment target identification unit 3431 recognizes a plurality of overlapping replenishment time zones, a first overlapping replenishment time zone TWD1, a second overlapping replenishment time zone TWD2, and a third overlapping replenishment time zone TWD3, in order from the earliest one in the time series. The first overlapping replenishment time zone TWD1 is a time zone where the replenishable time zone TWSA of the AF 241A1 and the replenishable time zone TWSB of AF 241A2 overlap. The most early time (earliest time) of the first overlapping replenishment time zone TWD1 matches with an earliest time T1 in the replenishable time zone TWSB of the AF 241A2, and the most late time (latest time) of the first overlapping replenishment time zone TWD1 matches with a latest time T2 in the replenishable time zone TWSA of the AF 241A1.

The second overlapping replenishment time zone TWD2 is a time zone in which the replenishable time zone TWSC of the AF 241A3 and the replenishable time zone TWSD of the tray feeder 245A1 overlap. The most early time (earliest time) of the second overlapping replenishment time zone TWD2 matches with an earliest time T3 in the replenishable time zone TWSC of the AF 241A3, and the most late time (latest time) of the second overlapping replenishment time zone TWD2 matches with a latest time T4 in the replenishable time zone TWSD of the tray feeder 245A1. The third overlapping replenishment time zone TWD3 is a time zone in which the replenishable time zone TWSE of the tray feeder 245A2 and the replenishable time zone TWSF of the stick feeder 246A1 overlap. The most early time (earliest time) of the third overlapping replenishment time zone TWD3 matches with an earliest time T5 in the replenishable time zone TWSF of the stick feeder 246A1, and the most late time (latest time) of the third overlapping replenishment time zone TWD3 matches with a latest time T6 in the replenishable time zone TWSE of the tray feeder 245A2.

Then, the replenishment target identification unit 3431 identifies all the component supply devices for which the component replenishment work can be performed in each of the overlapping replenishment time zones TWD1, TWD2, and TWD3 as the component replenishment target devices. The replenishment target identification unit 3431 identifies the component replenishment target device for each of the first to third overlapping replenishment time zones TWD1, TWD2, and TWD3. In the example shown in FIG. 12, the replenishment target identification unit 3431 identifies the AFs 241A1 and 241A2 as the component replenishment target devices for which the component replenishment work can be performed within the first overlapping replenishment time zone TWD1. Further, the replenishment target identification unit 3431 identifies the AF 241A3 and the tray feeder 245A1 as the component replenishment target devices for which the component replenishment work can be performed within the second overlapping replenishment time zone TWD2. Further, the replenishment target identification unit 3431 identifies the tray feeder 245A2 and the stick feeder 246A1 as the component replenishment target devices for which the component replenishment work can be performed within the third overlapping replenishment time zone TWD3.

As described above, the replenishment target identification unit 3431 identifies all the component supply devices for which the component replenishment work can be performed in each of the overlapping replenishment time zones TWD1, TWD2, and TWD3 as the component replenishment target devices. In this manner, for the component supply devices 241, 245, and 246 that can be replenished with the component storage member in each of the overlapping replenishment time zones TWD1, TWD2, and TWD3, "collective replenishment", in which the component replenishment work by the operator OP is collectively performed, becomes possible. For this reason, the frequency of the operator OP going to each of the component mounters 2 provided with the component supply devices 241, 245, and 246 can be reduced, and the load of the component replenishment work by the operator OP can be reduced.

Note that, as described above, when the identification result of the replenishable time zones TWSA to TWSF by the component supply monitoring unit 342 is updated in a predetermined cycle, the replenishment target identification unit 3431 updates the identification result of the component replenishment target device. Further, similar to the component supply monitoring unit 342, the replenishment target identification unit 3431 may be configured to identify the component replenishment target device in the first production period TW01 of the first substrate type, or identify the component replenishment target device in consideration of the production periods of the second and subsequent substrate types in addition to the first substrate type.

Next, the replenishment timing identification unit 3432 identifies the same replenishment work timing of the component replenishment work for the component replenishment target device identified by the replenishment target identification unit 3431 for the first to third overlapping replenishment time zones TWD1, TWD2, and TWD3. In the example shown in FIG. 12, the replenishment timing identification unit 3432 identifies a first replenishment work timing TH1 as a timing of the component replenishment work within the first overlapping replenishment time zone TWD1, the timing being the same for the AFs 241A1 and 241A2. Further, the replenishment timing identification unit 3432 identifies a second replenishment work timing TH2 as a timing of the component replenishment work within the second overlapping replenishment time zone TWD2, the timing being the same for the AF 241A3 and the tray feeder 245A1. Further, the replenishment timing identification unit 3432 identifies a third replenishment work timing TH3 as a timing of the component replenishment work within the third overlapping replenishment time zone TWD3, the timing being the same for the tray feeder 245A2 and the stick feeder 246A1.

It is desirable that the replenishment timing identification unit 3432 identify the earliest time T1 of the first overlapping replenishment time zone TWD1 as the first replenishment work timing TH1 within the first overlapping replenishment time zone TWD1. The earliest time T1 of the first overlapping replenishment time zone TWD1 is the earliest time in the first overlapping replenishment time zone TWD1. As the earliest time T1 that is the earliest time in the first overlapping replenishment time zone TWD1 is set as the first replenishment work timing TH1 as described above, the operator OP can perform the component replenishment work for the AFs 241A1 and 241A2 collectively in a state where there is enough time.

Similarly, it is desirable that the replenishment timing identification unit 3432 identify the earliest time T3 of the second overlapping replenishment time zone TWD2 as the second replenishment work timing TH2 within the second overlapping replenishment time zone TWD2, and identify the earliest time T5 of the third overlapping replenishment time zone TWD3 as the third replenishment work timing TH3 within the third overlapping replenishment time zone TWD3.

(Modified Example of Replenishment Management Unit)

Further, the replenishment target identification unit 3431 may be configured to divide the first production period TW01 into a plurality of specific periods TW11, TW12, and TW13 having a predetermined specific time as a time interval. The specific time defining the time interval of each of the specific periods TW11, TW12, TW13 is input by the operator OP via the operation unit 32, and is set to optional time such as 30 minutes. Hereinafter, in the order from the earliest in the time series, the specific periods are referred to as the first specific period TW11, the second specific period TW12, and the third specific period TW13. The time interval in each of the first to third specific periods TW11, TW12, and TW13 is set to be constant. Note that the specific time defining the time interval of the first to third specific periods TW11, TW12, and TW13 may have the same value as the work allowable time set by the setting unit 341.

The replenishment target identification unit 3431 recognizes the first to third overlapping replenishment time zones TWD1 to TWD3 that overlap in the replenishable time zones TWSA to TWSF corresponding to the component supply devices 241, 245, and 246. Furthermore, the replenishment target identification unit 3431 determines whether or not the earliest time of any one of the first to third overlapping replenishment time zones TWD1 to TWD3 is included in each of the first to third specific periods TW11, TW12, and TW13. In the example shown in FIG. 12, the first specific period TW11 includes the earliest time of the first overlapping replenishment time zone TWD1, the second specific period TW12 includes the earliest time of the second overlapping replenishment time zone TWD2, and the third specific period TW13 includes the earliest time of the third overlapping replenishment time zone TWD3.

In this case, the replenishment target identification unit 3431 identifies the AFs 241A1 and 241A2 as the component replenishment target devices for which the component replenishment work can be performed in a time zone between the earliest time of the first overlapping replenishment time zone TWD1 and the most late time (latest time) of the first specific period TW11 in the first overlapping replenishment time zone TWD1. Further, the replenishment target identification unit 3431 identifies the AF 241A3 and the tray feeder 245A1 as the component replenishment target devices for which the component replenishment work can be performed in a time zone between the earliest time of the second overlapping replenishment time zone TWD2 and the most late time (latest time) of the second specific period TW12 in the second overlapping replenishment time zone TWD2. Further, the replenishment target identification unit 3431 identifies the tray feeder 245A2 and the stick feeder 246A1 as the component replenishment target devices for which the component replenishment work can be performed in a time zone between the earliest time of the third overlapping replenishment time zone TWD3 and the most late time (latest time) of the third specific period TW13 in the third overlapping replenishment time zone TWD3.

The replenishment timing identification unit 3432 identifies the same first replenishment work timing TH1 for the AFs 241A1 and 241A2 in a time zone between the earliest time of the first overlapping replenishment time zone TWD1 and the latest time of the first specific period TW11 in the first overlapping replenishment time zone TWD1. Further, the replenishment timing identification unit 3432 identifies the same second replenishment work timing TH2 for the AF 241A3 and the tray feeder 245A1 in a time zone between the earliest time of the second overlapping replenishment time zone TWD2 and the latest time of the second specific period TW12 in the second overlapping replenishment time zone TWD2. Further, the replenishment timing identification unit 3432 identifies the same third replenishment work timing TH3 for the tray feeder 245A2 and the stick feeder 246A1 in a time zone between the earliest time of the third overlapping replenishment time zone TWD3 and the latest time of the third specific period TW13 in the third overlapping replenishment time zone TWD3.

(Regarding Component Replenishment Management Information Generated by Replenishment Management Unit)

The replenishment target identification unit 3431 of the replenishment management unit 343 generates the component replenishment management information JH4 shown in FIG. 13 as information indicating an identification result of the component replenishment target device. The replenishment target identification unit 3431 generates the component replenishment management information JH4 for each of the overlapping replenishment time zones TWD1, TWD2, and TWD3 shown in FIG. 12, or the specific periods TW11, TW12, and TW13 which are set when the component replenishment target device is identified. In other words, the component replenishment management information JH4 is generated by the replenishment target identification unit 3431 for each of the replenishment timings TH1, TH2, and TH3 (see FIG. 12) identified by the replenishment timing identification unit 3432. The component replenishment management information JH4 is information in which work allowable time information J40 indicating work allowable time WPT set by the setting unit 341 and work progress state information indicating a determination result of a progress state of the component replenishment work by the work progress determination unit 344 described later are added to the work list information J4. In the component replenishment management information JH4, the work list information J4 is information obtained by listing a work target area that represents the work area WA of the component mounter 2, in which the component replenishment target device is disposed, associated with the component replenishment target device for which the component replenishment work is performed in the work target area. In the work list information J4, the work target areas in which the component replenishment target devices are disposed are arranged in order from the upstream side to the downstream side of the movement route 6R of the operator OP and are listed.

As shown in FIG. 13, the work list information J4 is information in which the movement route number information J41, work target area number information J42, component mounting line name information J43, lane name information J44, the mounter type information J11, the set position information J12, the device type information J13, the component type information J14, the total component remaining number information J16, the component required number information J31, replenishable time information J45, warning time information J46, stop time information J47, producible time information J48, work progress state information J49 and the work standard time information J50 are associated with each other.

Each piece of information constituting the work list information J4 will be described with reference to FIGS. 13 and 14. Note that, in the example shown in FIG. 14, in the first work area WA1 of the first component mounter 2A, a plurality of AFs 241 and a splicing feeder SPF are disposed to coexist. Among them, two of the AFs 241A and the splicing feeder SPF are identified by the replenishment target identification unit 3431 as the component replenishment target device, and, in this manner, the first work area WA1 is set as the work target area. In the second work area WA2 of the second component mounter 2B, a plurality of AFs 241 are disposed. Among them, one of the AF 241A is identified by the replenishment target identification unit 3431 as the component replenishment target device, and, in this manner, the second work area WA2 is set as the work target area. In the third work area WA3 of the third component mounter 2C, a plurality of AFs 241 are disposed. Among them, four of the AFs 241A are identified by the replenishment target identification unit 3431 as the component replenishment target device, and, in this manner, the third work area WA3 is set as the work target area. In the fourth work area WA4 of the fourth component mounter 2D, a plurality of tray feeders 245 are disposed. Among them, two of the tray feeders 245A are identified by the replenishment target identification unit 3431 as the component replenishment target device, and, in this manner, the fourth work area WA4 is set as the work target area. In the fifth work area WA5 of the fifth component mounter 2E, a plurality of AFs 241 are disposed. However, among them, there exists no device that is identified by the replenishment target identification unit 3431 as the component replenishment target device. In the sixth work area WA6 of the sixth component mounter 2F, a plurality of stick feeders 246 are disposed. Among them, two of the stick feeders 246A are identified by the replenishment target identification unit 3431 as the component replenishment target device, and, in this manner, the sixth work area WA6 is set as the work target area.

The movement route number information J41 is information representing a movement route number for identifying the movement route 6R in the work area TWA. The work list information J4 of the component replenishment management information JH4 is generated for each of the movement routes 6R. Then, since one movement route number is assigned to one of the movement routes 6R, the movement route numbers represented by the movement route number information J41 are the same in the work list information J4 of one piece of component replenishment management information JH4. In the work list information J4, the work target areas in which the component replenishment target device is disposed are arranged in order from the upstream side to the downstream side of one of the movement routes 6R having the same movement route number represented by the movement route number information J41. That is, in the work list information J4, pieces of the component replenishment work performed by the operator OP moving from the upstream side to the downstream side on the movement route 6R are arranged in order from the top to the bottom. The work target area number information J42 is information for identifying each of the work target areas (the first work area WA1, the second work area WA2, the third work area WA3, the fourth work area WA4, and the sixth work area WA6) in which the component replenishment target device identified by the replenishment target identification unit 3431 is disposed. The component mounting line name information J43 is information for identifying the component mounting line 2L in the work area TWA. The lane name information J44 is information representing that the work target area represented by the work target area number information J42 belongs in a row (lane) of work areas positioned on either of the −Y side or the +Y side of each of the component mounters 2A to 2F.

The replenishable time information J45 is information representing time from the current time until the component replenishment work becomes possible for the component replenishment target device disposed at the set position represented by the set position information J12 in each of the work target areas represented by the work target area number information J42. The time until the component replenishment work becomes possible changes according to the number of remaining components in the preceding component storage member represented by the preceding component remaining number information J15 or the total number of remaining components represented by the total component remaining number information J16. For this reason, the replenishable time information J45 is updated in a predetermined cycle (for example, a cycle of 30 seconds) in response to the update of the preceding component remaining number information J15 or the total component remaining number information J16.

The warning time information J46 is information that represents time from the current time until the total number of remaining components represented by the total component remaining number information J16 reaches the component remaining number warning value in the component replenishment target device disposed at the set position represented by the set position information J12. The warning time information J46 is updated in a predetermined cycle (for example, a cycle of 30 seconds) in response to the update of the total component remaining number information J16. The stop time information J47 is information that represents time from the current time until the total number of remaining components represented by the total component remaining number information J16 reaches the component remaining number stop value in the component replenishment target device disposed at the set position represented by the set position information J12. In the AF 241A, the tray feeder (TF) 245A, and the stick feeder (SF) 246A as the component replenishment target devices, for example, in a case where the component remaining number stop value is set to zero (0), the stop time information J47 is information representing time from the current time until the total number of remaining components represented by the total component remaining number information J16 reaches zero (0). In the splicing feeder SPF as the component replenishment target device, for example, in a case where the component remaining number stop value is set to a predetermined value at which sending out of a tape for the splicing work is to be stopped, the stop time information J47 is information representing time from the current time until the total number of remaining components represented by the total component remaining number information J16 reaches the predetermined value. The producible time information J48 is information representing producible time that is time during which component supply according to the production of the component mounting substrate can be continued in the component replenishment target device disposed at the set position represented by the set position information J12. The producible time represented by the producible time information J48 indicates a time range in which component supply can be continued from the current time. Further, the producible time represented by the producible time information J48, which may be changed depending on the setting, is usually the same as the stop time represented by the stop time information J47.

Each of the warning time information J46, the stop time information J47, and the producible time information J48 is updated in a predetermined cycle (for example, a cycle of 30 seconds) in response to the update of the total component remaining number information J16. Further, each of the warning time information J46, the stop time information J47, and the producible time information J48 is also information that defines a component replenishment time limit that represents a time limit until the component replenishment work is required for the component replenishment target device. The component replenishment time limit is set for the component supply devices 241, 245, and 246. As the component replenishment time limit, time until the total number of remaining components represented by the total component remaining number information J16 reaches the component remaining number warning value, time until the total number of remaining components represented by the total component remaining number information J16 reaches the component remaining number stop value, time until the component supply by the component replenishment target device becomes impossible, and the like can be used. That is, unless the component replenishment work is performed for the component replenishment target device before the component replenishment time limit is reached, the possibility of the component replenishment stoppage by the component replenishment target device increases, which affects the production of the component mounting substrate.

The work progress state information J49 is information representing a determination result of a progress state of the component replenishment work by the work progress determination unit 344 described later. The work standard time information J50 is information representing the work standard time required from work start to work end of the component replenishment work for the component replenishment target device. The work standard time represented by the work standard time information J50 is set for each work type of the component replenishment work. For example, the work standard time for the component replenishment work to replenish the AF 241A with a new reel is set to "30 seconds", the work standard time for the component replenishment work to replenish the tray feeder 245A with a new pallet is set to "50 seconds", and the work standard time of the component replenishment work to replenish the stick feeder 246A with a new stick is set to "45 seconds". Further, the work standard time of the splicing work for the splicing feeder SPF is set to "90 seconds", for example. Note that the work standard time represented by the work standard time information J50 may be added with a weighting coefficient according to the work ability of the operator OP for each component replenishment work.

The component replenishment management information JH4 including the work list information J4 generated by the replenishment target identification unit 3431 is stored in the memory unit 346 of the component replenishment management system 3 and displayed on the display unit 33. Furthermore, the component replenishment management information JH4 is transmitted to the mounting control device 20 of each of the component mounters 2 and the mobile terminal device 7 carried by the operator OP via the communication unit 31. The memory unit 346 of the component replenishment management system 3 stores the component replenishment management information JH4 including the work list information J4 updated in response to the replenishment target identification unit 3431 updating the identification result of the component replenishment target device in a predetermined cycle. When the component replenishment management information JH4 is input to the mounting control device 20 of each of the component mounters 2, the display unit 203 of the mounting control device 20 displays the component replenishment management information JH4. Further, when the component replenishment management information JH4 is input to the mobile terminal device 7 carried by the operator OP, the component replenishment management information JH4 is displayed on the mobile terminal device 7.

The operator OP sequentially moves to the work target area represented by the work target area number information J42 in the work area TWA based on the component replenishment management information JH4 displayed on the mobile terminal device 7 and the like, and can perform the component replenishment work in each of the work target areas. When performing the component replenishment work in each of the work target areas, the operator OP can know the component replenishment target device disposed in the work target area based on the component replenishment management information JH4 displayed on the mobile terminal device 7 or the like.

<Regarding Work Progress Determination Unit>

Next, the work progress determination unit 344 monitors in real time a progress state of the component replenishment work performed for each of the component replenishment target devices identified by the replenishment target identification unit 3431, and determines that the progress state is in a state of either work end or work not performed. The work progress state information J49 representing a determination result of the progress state of the component replenishment work by the work progress determination unit 344 is added to the work list information J4 of the component replenishment management information JH4, as described above.

In a case where the component replenishment work for the component replenishment target device by the operator OP is not performed yet, the work progress determination unit 344 determines that the component replenishment work is "work not performed", and adds the work progress state information J49 representing the determination result to the work list information J4. In the example shown in FIGS. 13 and 14, the work progress determination unit 344 determines that the component replenishment work in the work target areas (the second work area WA2, the third work area WA3, the fourth work area WA4, and the sixth work area WA6) represented by the work target area number information J42 is "work not performed". Then, the work progress determination unit 344 sets the work progress state information J49 corresponding to these work target areas as "not performed".

In the work target area represented by the work target area number information J42, when the operator OP performs reading operation for the component type identifying barcode using the barcode reader 8, replenishment component type information JH01 (FIG. 14) is input via the external input and output unit 204 to the mounting control device 20 of the component mounter 2 for which the work target area is set. The mounting control device 20 to which the replenishment component type information JH01 is input transmits the replenishment component type information JH01 to the component replenishment management system 3 via the communication unit 201. In the component replenishment management system 3, when the communication unit 31 receives the replenishment component type information JH01 transmitted from the mounting control device 20, the work progress determination unit 344 determines that the progress state of the component replenishment work makes transition from "work not performed" to "work start" based on the work list information J4. More specifically, when the replenishment component type information JH01 is input, the work progress determination unit 344 extracts the set position information J12 associated with the component type information J14 representing the component of the same type as a component type of the replenishment component type information JH01. Then, the work progress determination unit 344 determines that the progress state of the component replenishment work for the component replenishment target device disposed at the set position represented by the extracted set position information J12 makes transition from "work not performed" to "work start".

When replenishment detection information JH02 (FIG. 14) is output from the component replenishment target device after the operator OP performs the reading operation for the component type identifying barcode using the barcode reader 8, the feeder control unit 240 transmits the replenishment detection information JH02 to the mounting control device 20. The replenishment detection information JH02 is information representing that the component replenishment work for the component replenishment target device is finished. For example, in a case where the component replenishment target device is the AF 241A, the detection information output from the first tape detection sensor 2416A when the first tape detection sensor 2416A detects the component storage tape is the replenishment detection information JH02 representing that the component replenishment work for the AF 241A is finished.

The mounting control device 20 to which the replenishment detection information JH02 is input transmits the replenishment detection information JH02 to the component replenishment management system 3 via the communication unit 201. In the component replenishment management system 3, when the communication unit 31 receives the replenishment detection information JH02 transmitted from the mounting control device 20, the work progress determination unit 344 determines that the progress state of the component replenishment work makes transition from "work start" to "work end" based on the work list information J4.

More specifically, when the replenishment detection information JH02 is input, the work progress determination unit 344 extracts the set position information J12 representing the set position where the component replenishment target device that has output the replenishment detection information JH02 is disposed. Then, the work progress determination unit 344 determines that the progress state of the component replenishment work for the component replenishment target device disposed at the set position represented by the extracted set position information J12 makes transition from "work start" to "work end", and adds the work progress state information J49 representing a result of the determination to the work list information J4. In the example shown in FIGS. 13 and 14, the work progress determination unit 344 determines that the progress state of the component replenishment work for the AF 241A disposed at set positions "S11" and "S12" and the splicing feeder SPF disposed at the set position "S13" represented by the set position information J12 makes transition from "work start" to "work end" in the first work area WA1 which is the work target area represented by the work target area number information J42. Then, the work progress determination unit 344 sets the work progress state information J49 corresponding to the set positions "S11", "S12", and "S13" of the set position information J12 as "work end".

<Regarding Extraction Unit>

Before the operator OP starts the component replenishment work in the work area TWA based on the component replenishment management information JH4, there is a case where the total work standard time represented by the work standard time information J50 exceeds the work allowable time WPT represented by the work allowable time information J40 for the component replenishment work for all the component replenishment target devices identified by the replenishment target identification unit 3431. In such a case, before the start of the component replenishment work in the work area TWA, the extraction unit 345 executes initial extraction operation for extracting the component replenishment target device for which the component replenishment work is to be performed within the work allowable time WPT among all the component replenishment target devices identified by the replenishment target identification unit 3431.

The extraction unit 345 executes the initial extraction operation based on the work list information J4 of the component replenishment management information JH4. Specifically, in the initial extraction operation, the extraction unit 345 extracts the component replenishment target devices for which the component replenishment work can be performed within the work allowable time WPT in descending order of priority of performing the component replenishment work based on time (component replenishment time limit) represented by the warning time information J46, the stop time information J47, or the producible time information J48 of the work list information J4. The extraction unit 345 determines that one having the short producible time represented by the producible time information J48 has a high priority of performing the component replenishment work. Alternatively, the extraction unit 345 may be configured to recognize that one having short time represented by the warning time information J46 or the stop time information J47 as having a high priority for performing the component replenishment work. The component replenishment work for the component replenishment target device that is not extracted in the initial extraction operation by the extraction unit 345 will be postponed to be performed when the operator OP makes the patrols of the work area TWA next time. Note that, in a case where the replenishment target identification unit 3431 is configured to identify the component replenishment target device for which the component replenishment work can be performed within the specific periods TW11, TW12, and TW13 having the work allowable time WPT as the time interval, the extraction unit 345 omits the initial extraction operation.

The operator OP sequentially moves to the work target area represented by the work target area number information J42 based on the component replenishment management information JH4 displayed on the mobile terminal device 7 and the like, and performs the component replenishment work in each of the work target areas. In a case where it takes time to perform the work in the process of performing the component replenishment work, if the operator OP performs the component replenishment work in order while moving on the movement route 6R based on the component replenishment management information JH4, there is a possibility that the work allowable time WPT elapses before the component replenishment work for all the component replenishment target device is finished. In a case where indispensable work to be performed exists among the component replenishment work that could not be finished within the work allowable time WPT, there is a possibility that the supply of the component from the component supply devices 241, 245, and 246 may be stopped due to the unperformed component replenishment work, and the production efficiency of the component mounting substrate may be lowered.

In view of the above, the extraction unit 345 extracts the component replenishment target device for which the component replenishment work is to be performed before the work time in the work area TWA by the operator OP reaches the work allowable time WPT among the component replenishment target devices whose progress state of the component replenishment work represented by the work progress state information J49 in the work list information J4 of the component replenishment management information JH4 is "work not performed". The extraction operation by the extraction unit 345 is executed every time the component replenishment work for one of the component replenishment target devices is finished, that is, every time the work progress determination unit 344 determines that the progress state of the component replenishment work for one of the component replenishment target devices makes transition from "work not performed" to "work end". Alternatively, the extraction operation by the extraction unit 345 is executed every time the component replenishment work for the component replenishment target device disposed in the work target area represented by the work target area number information J42 is finished.

More specifically, the extraction unit 345 measures remaining time LT until the work time in the work area TWA of the operator OP reaches the work allowable time WPT. As shown in FIGS. 15 and 16, remaining time information J51 representing the remaining time LT measured by the extraction unit 345 is added to the component replenishment management information JH4. Then, the extraction unit 345 extracts the component replenishment target device for which the component replenishment work can be performed within the remaining time LT among the component replenishment target devices whose progress state of the component replenishment work represented by the work progress state information J49 is "work not performed". The extraction unit 345 extracts the component replenishment target devices for which the component replenishment work can be performed within the remaining time LT in descending order of priority of performing the component replenishment work based on time (component replenishment time limit) represented by the warning time information J46, the stop time information J47, or the producible time information J48 of the work list information J4. The extraction unit 345 determines that one having the short producible time represented by the producible time information J48 has a high priority of performing the component replenishment work. However, the extraction unit 345 may be configured to recognize that one having short time represented by the warning time information J46 or the stop time information J47 as having a high priority for performing the component replenishment work. The extraction unit 345 extracts the component replenishment target device within a range in which the total of the work standard time represented by the work standard time information J50 of the work list information J4 does not exceed the remaining time LT. That is, total work time TO, which is the sum of the work standard time of the component replenishment work for the component replenishment target device to be extracted by the extraction unit 345, is set not to exceed the remaining time LT. As shown in FIGS. 15 and 16, total work time information J52 representing the total work time TO is added to the component replenishment management information JH4.

The extraction unit 345 sets, to a "skip" state, the progress state of the component replenishment work for the component replenishment target device that is excluded from an extraction target, among the component replenishment target devices whose progress state of the component replenishment work represented by the work progress state information J49 is "work not performed". At this time, the extraction unit 345 sets, to the "skip" state, the progress state of the component replenishment work for the component replenishment target device that is excluded from an extraction target after confirming that the component replenishment time limit (warning time, stop time, or producible time) corresponding to the component replenishment target device that is excluded from an extraction target is within the work allowable time set when the operator OP makes the patrols in the work area TWA next time. The component replenishment work for which the work progress state information J49 is set to the "skip" state by the extraction unit 345 will be postponed to when the operator OP makes the patrols in the work area TWA next time.

Here, the component replenishment work, such as the splicing work for the splicing feeder SPF, in which the work performing timing is restricted to running out of the component in the preceding component storage tape, has a high priority whenever the work can be performed, and cannot be postponed to when the operator OP makes the patrols next time. On the other hand, for the AF 241A, the tray feeder 245A, and the stick feeder 246A, "collective replenishment" in which the component replenishment work is performed collectively can be performed. The "collective replenishment" can be performed whenever a subsequent component storage member can be mounted without being restricted to running out of the component in a preceding component storage member. For this reason, the component replenishment work for the component replenishment target device that is the target of "collective replenishment" does not always have a high priority when the work can be performed, and can be postponed to when the operator OP makes the patrols next time. That is, application of the concept of "postponing to the patrols made next time" is made possible for the work in which "collective replenishment" can be performed, such as the component replenishment work for the component supply devices 241, 245, and 246 that can mount a plurality of component storage members.

In the example shown in FIG. 15, the extraction unit 345 first arranges the component replenishment target devices whose progress state of the component replenishment work represented by the work progress state information J49 is "work not performed" in the ascending order of the component replenishment time limit represented by the warning time information J46, the stop time information J47, or the producible time information J48 (in the descending order of the priority of performing the component replenishment work). The extraction unit 345 extracts the component replenishment target device within a range in which the total work time TO which is the total of the work standard time represented by the work standard time information J50 does not exceed the remaining time LT. In the example shown in FIG. 15, the AF 241A set at a set position "S21", the AF 241A set at a set position "S31", the tray feeder 245A set at a set position "S41", and the AF 241A set at a set position "S33" are the extraction target by the extraction unit 345. Furthermore, the extraction unit 345 sets, to the "skip" state, the progress state of the component replenishment work for the component replenishment target device that is excluded from the extraction target. In the example shown in FIG. 15, the stick feeder 246A set at set positions "S61" and "S62", the AF 241A set at set positions "S32" and "S34", and the tray feeder 245A set at a set position "S42" are excluded from the extraction target, and the progress state of the component replenishment work for them is set to the "skip" state.

When the extraction of the component replenishment target device is completed, the extraction unit 345 converts the work list information J4 (see FIG. 15) in which the component replenishment time limit represented by the warning time information J46, the stop time information J47, or the reproducible time information J48 is arranged in the ascending order into the work list information J4 (see FIG. 16) in which the work target areas represented by the work target area number information J42 are arranged in order from the upstream side to the downstream side of the movement route 6R. The extraction unit 345 outputs the component replenishment management information JH4 including the work list information J4 whose arrangement order has been changed as the component replenishment management information JH4 in which the extraction result of the component replenishment target device is reflected.

The component replenishment management information JH4, which is output from the extraction unit 345 and reflects the extraction result of the component replenishment target device, is displayed on the mobile terminal device 7 or the like. The operator OP preferably postpones the performance of the component replenishment work in which the work progress state information J49 is set to the "skip" state based on the component replenishment management information JH4 that reflects the extraction result of the component replenishment target device displayed on the mobile terminal device 7 or the like. Then, the operator OP can perform the component replenishment work of high priority, which is indispensable for the component replenishment target device extracted by the extraction unit 345, within the work allowable time WPT. In this manner, it is possible to improve the efficiency of the component replenishment work for the component replenishment target device by the operator OP.

The above-described extraction operation by the extraction unit 345 is repeated, for example, every time the component replenishment work for one of the component replenishment target devices is finished, and the component replenishment work by the operator OP progresses based on the component replenishment management information JH4 in which the extraction result of the extraction operation is reflected. In the example shown in FIG. 17, the operator OP performs the component replenishment work in the order of the first work area WA1, the second work area WA2, the third work area WA3, and the fourth work area WA4 as the work target areas represented by the work target area number information J42 while moving on the movement route 6R based on the component replenishment management information JH4 displayed on the mobile terminal device 7 or the like. The progress state of the component replenishment work for the component replenishment target device set to each set position of the set positions "S11", "S12", and "S13" of the first work area WA1, the set position "S21" of the second work area WA2, and the set positions "S31" and "S33" of the third work area WA3 is set to the "work end" state, and the component replenishment work for the component replenishment target device set to the set positions "S32" and "S34" of the third work area WA3 is set to the "skip" state.

Then, the operator OP stays in the fourth work area WA4, and the progress state is set to the "work end" state in accordance with the performance of the component replenishment work for the component replenishment target device set at the set position "S41". In the example shown in FIG. 17, at this time point, the work time in the work area TWA by the operator OP has not reached the work allowable time WPT due to a reason that the component replenishment work proceeds quickly or the like, and the extraction operation by the extraction unit 345 is executed. The stick feeder 246A set at the set positions "S61" and "S62" of the sixth work area WA6 by the extraction operation by the extraction unit 345 is extracted as the component replenishment target device for which the component replenishment work can be performed within the remaining time LT. The progress state of the component replenishment work for the component replenishment target devices set at the set positions "S61" and "S62" extracted by the latest extraction operation by the extraction unit 345 is set to the "work not performed" state.

The component replenishment target device set at the set positions "S61" and "S62" extracted by the latest extraction operation by the extraction unit 345 is excluded from the extraction target in the previous extraction operation, and the component replenishment work for the component replenishment target device is set to the "skip" state (see FIG. 16). As described above, in the process in which the extraction operation by the extraction unit 345 is repeated, there is a case where the component replenishment target device that is set to the "skip" state and excluded from the extraction target is extracted as the component replenishment target device for which the component replenishment work can be performed within the remaining time LT, due to a reason that the component replenishment work progresses quickly or the like. However, as in the example shown in FIG. 17, in a state where the operator OP stays in the fourth work area WA4, the operator OP has already passed through the third work area WA3 located upstream of the fourth work area WA4. Therefore, the component replenishment target device set at the set positions "S32" and "S34" of the third work area WA3 that the operator OP has passed through is not extracted by the extraction unit 345. Note that, as described above, the extraction unit 345 extracts the component replenishment target device for which the component replenishment work can be performed within the remaining time LT from the component replenishment target devices set to the "skip" state based on the determination as to whether or not the operator OP has passed through. In this case, the extraction unit 345, which is preferably configured to determine the passage of the operator OP for each of the work areas WA set to the component mounter 2, may also be configured to determine the passage of the operator OP for each of the component supply devices disposed in the work area WA.

As described above, in the component replenishment management system 3, the work allowable time WPT of the operator OP in the work area TWA is set by the setting unit 341, and the component replenishment target device that is the target of the component replenishment work by the operator OP is identified by the replenishment target identification unit 3431. The operator OP can perform the component replenishment work for the component replenishment target device while moving on the movement route 6R in the work area TWA using the work allowable time WPT as a guide. In a case where it takes time to perform the work in the process of performing the component replenishment work, if the operator OP performs the component replenishment work in order while moving on the movement route 6R, there is a possibility that the work allowable time WPT elapses before the component replenishment work for all the component replenishment target device is finished. In view of the above, the progress state of the component replenishment work by the operator OP in the work area TWA is determined in real time by the work progress determination unit 344. Then, the extraction unit 345 extracts the component replenishment target device for which the component replenishment work is to be performed before the work time in the work area TWA by the operator OP reaches the work allowable time WPT among the component replenishment target devices whose progress state of the component replenishment work in real time is "work not performed". In this manner, the operator OP can postpone the component replenishment work for the component replenishment target device that is excluded from the extraction target by the extraction unit 345, and perform the component replenishment work of high priority, which is indispensable for the component replenishment target device extracted by the extraction unit 345, within the work allowable time WPT.

Note that the extraction unit 345 may be configured to output the component replenishment management information JH4 to which information (work request information) for requesting another operator to perform the component replenishment work for the component replenishment target device is added, instead of setting the component replenishment target device excluded from the extraction target to the "skip" state, or together with setting the component replenishment target device excluded from the extraction target to the "skip" state. The component replenishment management information JH4 to which the work request information is added is displayed on the mobile terminal device 7 or the like carried by the operators OP including another operator. The another operator can perform the component replenishment work set to the "skip" state based on the work request information added to the component replenishment management information JH4 displayed on the mobile terminal device 7 or the like.

Further, there is a case where, when the operator OP reaches the end point 6RE of the movement route 6R and all the component replenishment work other than the component replenishment work for the component replenishment target device that is set to the "skip" state is finished, the work time in the work area TWA by the operator OP has not reached the work allowable time WPT. In this case, for example, the extraction unit 345 may be configured to output the component replenishment management information JH4 to which information (work demand information) for demanding the performance of the component replenishment work for the component replenishment target device set to the "skip" state is added. The component replenishment management information JH4 to which the work demand information is added is displayed on the mobile terminal device 7 or the like carried by the operators OP. The operator OP can perform the component replenishment work demanded by the work demand information added to the component replenishment management information JH4 displayed on the mobile terminal device 7 or the like in reverse order from the end point 6RE to the start point 6RS on the movement route 6R.

Further, for example, in the process in which the operator OP sequentially performs the component replenishment work based on the work list information J4 of the component replenishment management information JH4 displayed on the mobile terminal device 7 or the like, the operator OP may forget the component replenishment work in the work area WA set to one component mounter 2 and starts the component replenishment work in the work area WA set to a next component mounter 2. In this case, the extraction unit 345 may be configured to set the progress state of one component replenishment work that the operator OP has forgotten to the "skip" state. However, in a case where the one component replenishment work that the operator OP has forgotten is high priority work that must be performed within the work allowable time WPT, the extraction unit 345 outputs warning information for warning that the component replenishment work is forgotten. A timing at which the extraction unit 345 outputs the warning information is, for example, a timing at which the replenishment component type information JH01 from the mounting control device 20 of the next component mounter 2 is input via the communication unit 31. The operator OP can recognize that the component replenishment work is forgotten based on the warning information. Alternatively, the extraction unit 345 may be configured to output work non-permission information that does not permit the component replenishment work in the work area WA set to a next component mounter 2 when the replenishment component type information JH01 from the mounting control device 20 of the next component mounter 2 is input via the communication unit 31 in a state where the one component replenishment work is forgotten. The work non-permission information is information that does not permit the performance of the component replenishment work corresponding to the replenishment component type information JH01 unless the one component replenishment work is finished. Based on the work non-permission information, the operator OP can perform the forgotten component replenishment work and then perform the component replenishment work corresponding to the replenishment component type information JH01.

Further, assume a case where, for example, the component supply device belonging to the first overlapping replenishment time zone TWD1 is extracted by the extraction unit 345 as the component replenishment target device that is a target of the component replenishment work this time. In this case, the component supply device that belongs to the first overlapping replenishment time zone TWD1 is the component replenishment target device. However, there is a case where, for example, for the component supply device that belongs to the second overlapping replenishment time zone TWD2, the component replenishment work can be performed in the range of the first overlapping replenishment time zone TWD1. For this component supply device, in a case where it is assumed that the work time by the operator OP has not reached the work allowable time WPT at a timing at which the operator OP arrives at the end point 6RE of the movement route 6R and all the component replenishment work for the component replenishment target device belonging to the first overlapping replenishment time zone TWD1 is assumed to be finished, the extraction unit 345 may be configured to operate as described below. That is, the extraction unit 345 outputs the component replenishment management information JH4 to which information (work permission information) for permitting the performance of the component replenishment work for the component supply device belonging to the second overlapping replenishment time zone TWD2 that is scheduled as the target of the next component replenishment work is added. The timing at which the extraction unit 345 outputs the component replenishment management information JH4 to which the work permission information is added may be a time point during the movement on the movement route 6R of the operator OP, or at a time point at which the operator OP reaches the end point 6RE of the movement route 6R. The component replenishment management information JH4 to which the work permission information is added is displayed on the mobile terminal device 7 or the like carried by the operators OP. The operator OP can perform the component replenishment work for the component supply device belonging to the second overlapping replenishment time zone TWD2 based on the work permission information added to the component replenishment management information JH4 displayed on the mobile terminal device 7 or the like.

<Regarding Modified Example of Operation of Component Replenishment Management System>

The setting unit 341 may be configured to divide the work area TWA into a plurality of unit areas and set a time limit for each of the unit areas such that the total time becomes the work allowable time WPT. In this case, the extraction unit 345 is configured to extract the component replenishment target device for each of the unit areas.

First Modified Example

Figure 18A:
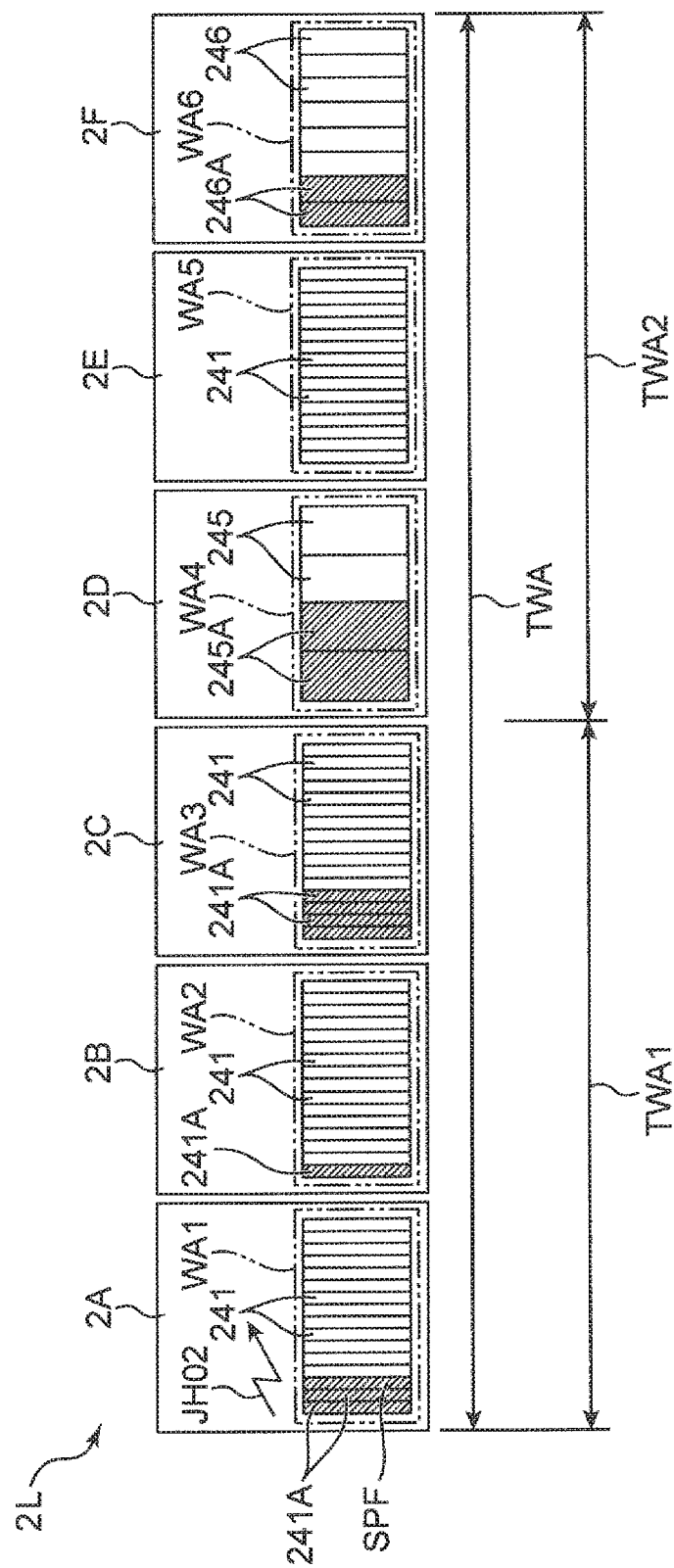
FIG. 18A is a diagram for describing a modified example of the operation of the component replenishment management system.

FIG. 18A is a diagram for describing a first modified example of the operation of the component replenishment management system 3. The setting unit 341 divides the work area TWA into a plurality of unit areas TWA1 and TWA2 so that the movement route 6R is evenly divided or the existing numbers of the component replenishment target devices are equal. Alternatively, the setting unit 341 may divide the work area TWA for each line of the component mounting line 2L. In the example shown in FIG. 18A, the setting unit 341 divides the work area TWA into the first unit area TWA1 and the second unit area TWA2 so that the movement route 6R is equally divided into two. Hereinafter, an example in which the setting unit 341 divides the work area TWA into two, the first unit area TWA1 and the second unit area TWA2, will be described.

The setting unit 341 sets a time limit for each of the first and second unit areas TWA1 and TWA2 so that the total time becomes the work allowable time WPT. At this time, the setting unit 341 sets the time limit for each of the unit areas TWA1 and TWA2 based on the work standard time of the component replenishment work for the component replenishment target devices existing in the unit areas TWA1 and TWA2. Alternatively, the setting unit 341 may set the time limit for each of the unit areas TWA1 and TWA2 so that the work allowable time WPT is evenly distributed to the unit areas TWA1 and TWA2.

Figure 19:
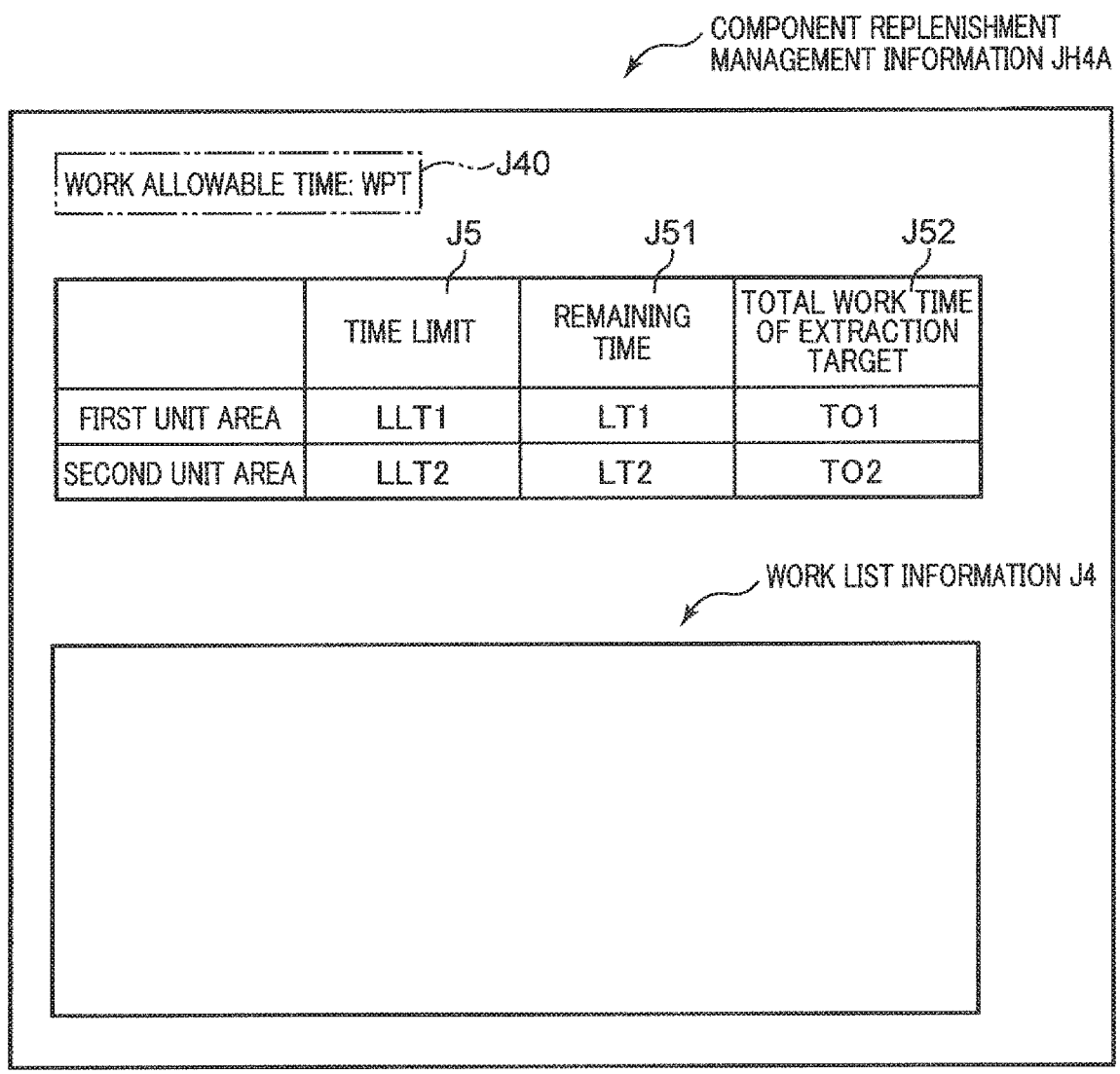
FIG. 19 is a diagram for describing the component replenishment management information to which an extraction result in a case where extraction operation is executed by the extraction unit is added, regarding the modified example of the operation of the component replenishment management system.

As described above, in a case where the work area TWA is divided into a plurality of first and second unit areas TWA1 and TWA2 by the setting unit 341, the extraction unit 345 extracts the component replenishment target device for each of the unit areas TWA1 and TWA2. The extraction operation by the extraction unit 345 will be described below with reference to FIG. 19. FIG. 19 is a diagram for describing component replenishment management information JH4A to which an extraction result in a case where the extraction operation by the extraction unit 345 is executed is added, regarding the modified example of the operation of the component replenishment management system 3. Note that the component replenishment management information JH4A shown in FIG. 19 includes the work list information J4 and the work allowable time information J40 similar to the component replenishment management information JH4 shown in FIG. 13 and the like described above, and further includes time limit information J5 representing the time limit set for each of the unit areas TWA1 and TWA2 by the setting unit 341.

The extraction unit 345 measures remaining time LT1 and LT2 until the work time in the unit areas TWA1 and TWA2 by the operator OP reaches the time limit represented by the time limit information J5 for each of the unit areas TWA1 and TWA2. As shown in FIG. 19, the remaining time information J51 representing the remaining time LT1 and LT2 measured by the extraction unit 345 is added to the component replenishment management information JH4A. Then, the extraction unit 345 extracts, for each of the unit areas TWA1 and TWA2, the component replenishment target device for which the component replenishment work can be performed within the remaining time LT1 and LT2 among the component replenishment target devices whose progress state of the component replenishment work represented by the work progress state information in the work list information J4 is "work not performed".

The extraction unit 345 extracts, for each of the unit areas TWA1 and TWA2, the component replenishment target devices for which the component replenishment work can be performed within the remaining time LT1 and LT2 in the descending order of priority of performing the component replenishment work based on the component replenishment time limit represented by the warning time information, the stop time information, or the producible time information in the work list information J4. The extraction unit 345 extracts the component replenishment target device within a range in which the total of the work standard time represented by the work standard time information in the work list information J4 does not exceed the remaining time LT1 and LT2. That is, total work time TO1 and TO2, which are the sum in each of the unit areas TWA1 and TWA2 of the work standard time of the component replenishment work for the component replenishment target device to be extracted by the extraction unit 345, are set not to exceed the remaining time LT1 and LT2. As shown in FIG. 19, the total work time information J52 representing the total work time TO1 and TO2 is added to the component replenishment management information JH4A.

The extraction unit 345 sets, to the "skip" state, the progress state of the component replenishment work for the component replenishment target device that is excluded from an extraction target, among the component replenishment target devices whose progress state of the component replenishment work represented by the work progress state information in the work list information J4 is "work not performed". The component replenishment work for which the work progress state information is set to the "skip" state by the extraction unit 345 will be postponed to when the operator OP makes the patrols in the work area TWA next time. When the extraction of the component replenishment target device is completed, the extraction unit 345 outputs the component replenishment management information JH4A in which the extraction result of the component replenishment target device is reflected.

The component replenishment management information JH4A, which is output from the extraction unit 345 and reflects the extraction result of the component replenishment target device for each of the unit areas TWA1 and TWA2, is displayed on the mobile terminal device 7 or the like. The operator OP preferably postpones the performance of the component replenishment work in which the work progress state information in the work list information J4 is set to the "skip" state based on the component replenishment management information JH4A displayed on the mobile terminal device 7 or the like. Then, the operator OP can perform the component replenishment work of high priority, which is indispensable for the component replenishment target device extracted by the extraction unit 345, within the time limit set to each of the unit areas TWA1 and TWA2.

As described above, regarding the first modified example of the operation of the component replenishment management system 3, the extraction unit 345 extracts the component replenishment target device for which the component replenishment work can be performed in the remaining time LT1 and LT2 until the time limit is reached for each of the unit areas TWA1 and TWA2 set by the setting unit 341. In this manner, the component replenishment target devices for which performance of the component replenishment work is postponed, the component replenishment target device being excluded from the extraction target by the extraction unit 345, can be prevented from concentrating, for example, on the downstream side of the movement route 6R as much as possible. For this reason, the operator OP can perform the component replenishment work for the component replenishment target device extracted by the extraction unit 345 in a well-balanced manner for each of the unit areas TWA1 and TWA2 from the upstream side to the downstream side of the movement route 6R.

Second Modified Example

FIG. 18B is a diagram for describing a second modified example of the operation of the component replenishment management system 3. The setting unit 341 may recognize, as a device of interest, the component replenishment target device having the shortest component replenishment time limit represented by the warning time information, the stop time information, or the producible time information in the work list information J4 in the component replenishment management information JH4A shown in FIG. 19, and divide the work area TWA into the plurality of unit areas TWA1 and TWA2 based on the device of interest. In the example shown in FIG. 18B, the setting unit 341 recognizes the AF 241A set in the second work area WA2 as a device of interest, and divides the work area TWA into the first unit area TWA1 and the second unit area TWA2 such that the device of interest is disposed at a downstream end of the first unit area TWA1 on the most upstream side in the movement route 6R.

The setting unit 341 sets a time limit for each of the first and second unit areas TWA1 and TWA2 so that the total time becomes the work allowable time WPT. At this time, the setting unit 341 sets the component replenishment time limit set for the device of interest as the time limit in the first unit area TWA1 in which the device of interest is disposed.

As described above, in a case where the work area TWA is divided into a plurality of first and second unit areas TWA1 and TWA2 by the setting unit 341, the extraction unit 345 extracts the component replenishment target device for each of the unit areas TWA1 and TWA2. In this aspect, the operator OP can perform the component replenishment work for the device of interest having the shortest component replenishment time limit, that is, the component replenishment work having the highest priority of performing the component replenishment work, using the component replenishment time limit set for the device of interest as a guide.

Note that the specific embodiments described above mainly have a configuration below.

A component replenishment management system according to one aspect of the present disclosure is a system that manages component replenishment work for replenishing each of a plurality of component supply devices capable of mounting a plurality of component storage members with the component storage member in one or a plurality of component mounting lines in which a plurality of component mounters are connected, the component mounters being for mounting a component supplied from the plurality of component supply devices on a substrate to produce a component mounting substrate. The component replenishment management system includes a setting unit configured to set work allowable time from a start point to an end point of a predetermined movement route in a work area set to the component mounting lines for an operator who performs the component replenishment work while moving on the movement route in the work area, a replenishment target identification unit configured to identify a plurality of component supply devices for which the component replenishment work is allowed to be performed as a component replenishment target device that is a target of the component replenishment work based on a supply state of a component in each of the plurality of component supply devices, a work progress determination unit configured to monitor a progress state of the component replenishment work for each of the component replenishment target devices and determines whether the progress state is a state of work end or work not performed, and an extraction unit configured to extract a component replenishment target device for which the component replenishment work is to be performed before work time in the work area by the operator reaches the work allowable time among the component replenishment target devices whose progress state of the component replenishment work is the work not performed.

According to the component replenishment management system, the work allowable time of the operator in the work area is set by the setting unit, and the component replenishment target device that is the target of the component replenishment work by the operator is identified by the replenishment target identification unit. The operator can perform the component replenishment work for the component replenishment target device while moving on the movement route in the work area using the work allowable time as a guide. In a case where it takes time to perform the work in the process of performing the component replenishment work, if the operator performs the component replenishment work in order while moving on the movement route, there is a possibility that the work allowable time elapses before the component replenishment work for all the component replenishment target device is finished. In view of the above, the progress state of the component replenishment work by the operator in the work area is determined in real time by the work progress determination unit. Then, the extraction unit extracts the component replenishment target device for which the component replenishment work is to be performed before the work time in the work area by the operator reaches the work allowable time among the component replenishment target devices whose progress state of the component replenishment work in real time is work not performed. In this manner, the operator can postpone the component replenishment work for the component replenishment target device that is excluded from the extraction target by the extraction unit, and perform the component replenishment work, which is indispensable, for the component replenishment target device extracted by the extraction unit within the work allowable time. For this reason, it is possible to improve the efficiency of the component replenishment work for the component replenishment target device by the operator.

In the above component replenishment management system, work standard time required from work start to work end is set to the component replenishment work. Then, the extraction unit may be configured to measure remaining time until work time in the work area by the operator reaches the work allowable time, and extract the component replenishment target device for which the component replenishment work is allowed to be performed within the remaining time based on the work standard time.

Further, in the above component replenishment management system, a component replenishment time limit until the component replenishment work needs to be performed is set to the component supply device. Then, the extraction unit may be configured to extract a component replenishment target device for which the component replenishment work is allowed to be performed within the remaining time in order of priority of performing the component replenishment work based on the component replenishment time limit.

In this aspect, the component replenishment target devices for which the work is to be performed are extracted in the descending order of priority of the component replenishment work. In this manner, the operator can perform the component replenishment work of high priority for the component replenishment target device extracted by the extraction unit within the work allowable time.

The above component replenishment management system may have a configuration, in which the setting unit is configured to divide the work area into a plurality of unit areas, and sets a time limit for each of the unit areas such that total time becomes the work allowable time, and the extraction unit is configured to measure, for each of the unit areas, remaining time until work time in the unit areas by the operator reaches the time limit, and extracts a component replenishment target device for which the component replenishment work is allowed to be performed within the remaining time.

In this aspect, the extraction unit extracts, for each of the unit areas set by the setting unit, a component replenishment target device for which the component replenishment work can be performed within the remaining time until the time limit is reached. In this manner, the component replenishment target devices for which performance of the component replenishment work is postponed, the component replenishment target device being excluded from the extraction target by the extraction unit, can be prevented from concentrating, for example, on the downstream side of the movement route as much as possible. For this reason, the operator can perform the component replenishment work for the component replenishment target device extracted by the extraction unit in a well-balanced manner for each of the unit areas from the upstream side to the downstream side of the movement route.

The above component replenishment management system may have a configuration, in which the setting unit recognizes the component supply device having the component replenishment time limit being shortest as a device of interest, and divides the work area so that the device of interest is disposed at a downstream end of the unit area on a most upstream side in the movement route, and sets the component replenishment time limit set to the device of interest as the time limit in the unit area in which the device of interest is disposed.

In this aspect, the operator can perform the component replenishment work for the device of interest having the shortest component replenishment time limit, that is, the component replenishment work having the highest priority of performing the component replenishment work, using the component replenishment time limit set for the device of interest as a guide.

A component mounting system according to another aspect of the present disclosure includes one or a plurality of component mounting lines in which a plurality of component mounters are connected, the component mounters being for mounting a component supplied from a plurality of component supply devices capable of mounting a component storage member on a substrate to produce a component mounting substrate, and the component replenishment management system that manages component replenishment work for replenishing each of the plurality of component supply devices with the component storage member.

According to this component mounting system, the component replenishment management system capable of improving the efficiency of the component replenishment work for the component supply device is included. Accordingly, stoppage of the supply of the component from the component supply device due to delay in the replenishment work by the operator during the production of the component mounting substrate is suppressed as much as possible. In this manner, lowering in the production efficiency of the component mounting substrate can be suppressed.

As described above, according to the present disclosure, the component replenishment management system capable of improving the efficiency of the component replenishment work for the component supply device, and the component mounting system including the component replenishment management system can be provided.

What is claimed is:

1. A component replenishment management system that manages component replenishment work for replenishing each of a plurality of component supply devices capable of mounting a plurality of component storage members with the component storage member in one or a plurality of component mounting lines in which a plurality of component mounters are connected, the component mounters being for mounting a component supplied from the plurality of component supply devices on a substrate to produce a component mounting substrate, the component replenishment management system comprising:

a controller including a processor configured to:

set work allowable time from a start point to an end point of a predetermined movement route in a work area set to each of the component mounting lines for an operator who performs the component replenishment work while moving on the movement route in the work area;

identify a plurality of component supply devices for which the component replenishment work is allowed to be performed as a component replenishment target device that is a target of the component replenishment work based on a supply state of a component in each of the plurality of component supply devices;

monitor a progress state of the component replenishment work for each of the component replenishment target devices and determine whether the progress state is a state of work end or work not performed; and extract a component replenishment target device for which the component replenishment work is to be performed before work time in the work area by the operator reaches the work allowable time among the component replenishment target devices whose progress state of the component replenishment work is the work not performed, the extraction being executed every time the progress state of the component replenishment work for one of the component replenishment target devices transitions from the work not performed to the work end.

2. The component replenishment management system according to claim 1, wherein work standard time required from work start to work end is set to the component replenishment work, and the processor is configured to measure remaining time until work time in the work area by the operator reaches the work allowable time, and extract the component replenishment target device for which the component replenishment work is allowed to be performed within the remaining time based on the work standard time.

3. The component replenishment management system according to claim 2, wherein
- a component replenishment time limit until the component replenishment work needs to be performed is set to the component supply device, and
- the processor is configured to extract a component replenishment target device for which the component replenishment work is allowed to be performed within the remaining time in order of priority of performing the component replenishment work based on the component replenishment time limit.

4. The component replenishment management system according to claim 3, wherein
- the processor is configured to divide the work area into a plurality of unit areas, and set a time limit for each of the unit areas such that total time becomes the work allowable time, and
- measure, for each of the unit areas, remaining time until work time in each of the unit areas by the operator reaches the time limit, and extract a component replenishment target device for which the component replenishment work is allowed to be performed within the remaining time.

5. The component replenishment management system according to claim 4, wherein
- the processor is configured to
- recognize the component supply device having the component replenishment time limit being shortest as a device of interest, and divides the work area so that the device of interest is disposed at a downstream end of the unit area on a most upstream side in the movement route, and
- set the component replenishment time limit set to the device of interest as the time limit in the unit area in which the device of interest is disposed.

6. A component mounting system comprising:
- the one or the plurality of component mounting lines in which the plurality of component mounters are connected, each component mounter is a motor-driven device for mounting the component supplied from the plurality of component supply devices capable of mounting the component storage member on the substrate to produce the component mounting substrate; and
- the component replenishment management system according to claim 1 that manages component replenishment work for replenishing each of the plurality of component supply devices with the component storage member.

7. A component mounting system comprising:
- the one or the plurality of component mounting lines in which the plurality of component mounters are connected, each component mounter is a motor-driven device for mounting the component supplied from the plurality of component supply devices capable of mounting the component storage member on the substrate to produce the component mounting substrate; and
- the component replenishment management system according to claim 2 that manages component replenishment work for replenishing each of the plurality of component supply devices with the component storage member.

8. A component mounting system comprising:
- the one or the plurality of component mounting lines in which the plurality of component mounters are connected, each component mounter is a motor-driven device for mounting the component supplied from the plurality of component supply devices capable of mounting the component storage member on the substrate to produce the component mounting substrate; and
- the component replenishment management system according to claim 3 that manages component replenishment work for replenishing each of the plurality of component supply devices with the component storage member.

9. A component mounting system comprising:
- the one or the plurality of component mounting lines in which the plurality of component mounters are connected, each component mounter is a motor-driven device for mounting the component supplied from the plurality of component supply devices capable of mounting the component storage member on the substrate to produce the component mounting substrate; and
- the component replenishment management system according to claim 4 that manages component replenishment work for replenishing each of the plurality of component supply devices with the component storage member.

10. A component mounting system comprising:
- the one or the plurality of component mounting lines in which the plurality of component mounters are connected, each component mounter is a motor-driven device for mounting the component supplied from the plurality of component supply devices capable of mounting the component storage member on the substrate to produce the component mounting substrate; and
- the component replenishment management system according to claim 5 that manages component replenishment work for replenishing each of the plurality of component supply devices with the component storage member.

* * * * *